(12) United States Patent
Chung et al.

(10) Patent No.: US 8,933,441 B2
(45) Date of Patent: *Jan. 13, 2015

(54) ORGANIC ELECTRONIC DEVICE

(71) Applicant: Samsung Electronics Co., Ltd., Suwon-si (KR)

(72) Inventors: Jong Won Chung, Hwaseong-si (KR); Bang Lin Lee, Suwon-si (KR); Jeong Il Park, Seongnam-si (KR); Yong Wan Jin, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/736,399

(22) Filed: Jan. 8, 2013

(65) Prior Publication Data

US 2013/0187134 A1 Jul. 25, 2013

(30) Foreign Application Priority Data

Jan. 20, 2012 (KR) .................. 10-2012-0006981

(51) Int. Cl.
*C07D 417/14* (2006.01)
*C07D 421/14* (2006.01)
*H01L 51/50* (2006.01)
*C08G 61/12* (2006.01)
*H01L 51/10* (2006.01)
*H01L 51/05* (2006.01)
*H01L 51/00* (2006.01)

(52) U.S. Cl.
CPC ........ *H01L 51/105* (2013.01); *C08G 2261/323* (2013.01); *C08G 2261/95* (2013.01); *Y02E 10/549* (2013.01); *H01L 51/0558* (2013.01); *C08G 2261/411* (2013.01); *C08G 2261/91* (2013.01); *C08G 2261/3246* (2013.01); *C08G 2261/3142* (2013.01); *H01L 51/0043* (2013.01); *C08G 2261/3223* (2013.01); *C08G 2261/412* (2013.01); *C08G 2261/124* (2013.01); *C08G 2261/3229* (2013.01); *C08G 2261/3241* (2013.01); *C08G 61/123* (2013.01); *C08G 2261/1412* (2013.01); *C08G 2261/92* (2013.01); *H01L 51/0036* (2013.01); *C08G 61/126* (2013.01); *C08G 2261/526* (2013.01); *C08G 2261/3243* (2013.01); *C08G 2261/94* (2013.01); *C08G 2261/1424* (2013.01); *C08G 2261/414* (2013.01); *C08G 2261/344* (2013.01); *H01L 51/0545* (2013.01)
USPC ............. 257/40; 548/205; 548/135; 548/100; 548/110; 544/48

(58) Field of Classification Search
None
See application file for complete search history.

(56) References Cited

U.S. PATENT DOCUMENTS 6,166,172 A 12/2000 McCullough et al.
8,609,803 B2 * 12/2013 Lee et al. ................ 528/377
2005/0082525 A1 4/2005 Heeney et al.
2011/0001131 A1 1/2011 Lee et al.

FOREIGN PATENT DOCUMENTS

JP 2007-088222 A 4/2007
JP 2010-238880 A 10/2010

OTHER PUBLICATIONS

U.S. Appl. No. 14/077,888, filed Jan. 2014, Lee et al.*
Slocum, D. W. and Gierer, P. L., "Directed Metalation Reactions.8.1 Directed Metalation of 3-Mono- and 2,5-Disubstituted Thiophenes", J. Org. Chem., vol. 41, No. 23, pp. 3668-3673, 1976.
Koβmehl, G. et al., "Über Polyarylenalkenylene and Polyheteroarylenalkenylene, 14a)", Makromol. Chem., vol. 184, pp. 627-650, 1983.
Hou, J. et al., "Bandgap and Molecular Energy Level Control of Conjugated Polymer Photovoltaic Materials Based on Benzo[1,2-b:4,5-b']dithiophene", Macromolecules 2008, vol. 41, pp. 6012-6018.
Dondoni, A. et al., "Synthesis of Stannylthiazoles and Mixed Stannylsilylthiazoles and their Use for a Convenient Preparation of Mono- and Bis-halothiazoles", Synthesis, Sep. 1986, pp. 757-759.
Pan, H. et al., "Low-Temperature, Solution-Processed, High-Mobility Polymer Semiconductors for Thin-Film Transistors", J. Am. Chem. Soc., 2007, vol. 129, pp. 4112-4113.

(Continued)

*Primary Examiner* — Michael Barker
(74) *Attorney, Agent, or Firm* — Harness, Dickey & Pierce, P.L.C.

(57) ABSTRACT

An organic electronic device may include an organic semiconductor compound represented by the following Chemical Formula 1 or Chemical Formula 2.

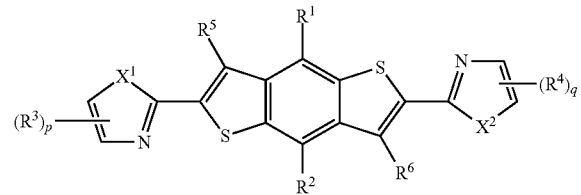

[Chemical Formula 1]

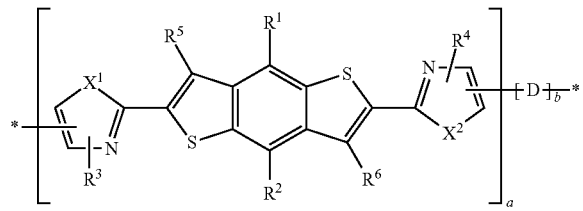

[Chemical Formula 2]

Each substituent of the above Chemical Formulas 1 and 2 may be the same as described in the detailed description.

14 Claims, 8 Drawing Sheets

(56) References Cited

OTHER PUBLICATIONS

Milstein, D. and Stille, J. K., "A General, Selective, and Facile Method for Ketone Synthesis from Acid Chlorides and Organotin Compounds Catalyzed by Palladium", Journal of the American Chemical Society, vol. 100:11, May 24, 1978, pp. 3636-3638.

Farina, V. and Krishna, B., "Large Rate Accelerations in the Stille Reaction with Tri-2-furylphosphine and Triphenylarsine as Palladium Ligands: Mechanistic and Synthetic Implications", J. Am. Chem. Soc., 1991, vol. 113, pp. 9585-9595.

Yamamoto, T. et al., "Preparation of π-Conjugated Poly(thiophene-2,5-diyl), Poly(p-phenylene), and Related Polymers Using Zerovalent Nickel Complexes. Linear Structure and Properties of the π-Conjugated Polymers", Macromolecules, 1992, vol. 25, pp. 1214-1223.

Van Pham, C. et al., "Lithiation Reaction of 2,5-Dibromothiophene. 13C NMR Spectra of 3-Substituted Derivatives", J. Org. Chem., 1984, vol. 49, pp. 5250-5253.

Stille, J., "The Palladium-Catalyzed Cross-Coupling Reactions of Organotin Reagents with Organic Electrophiles", Angew. Chem. Int. Ed. Engl., vol. 25, 1986, pp. 508-524.

Miyaura, N. et al., "Palladium-Catalyzed Inter- and Intramolecular Cross-Coupling Reactions of B-Alkyl-9borabicyclo[3.3.1]nonane Derivatives with 1-Halo-1-alkenes or Haloarenes. Syntheses of Functionalized Alkenes, Arenes, and Cycloalkenes via Hydroboration-Coupling Sequence", J. Am. Chem. Soc., 1989, vol. 111, pp. 314-321.

Yang et al., J. Phys. Chem. C, 2010, vol. 114, pp. 17989-177994.

Office Action for corresponding U.S. Appl. No. 14/077,888 dated Jan. 27, 2014.

Office Action for corresponding U.S. Appl. No. 13/479,036 dated Mar. 4, 2013.

Office Action for corresponding U.S. Appl. No. 14/077,888 dated Jun. 12, 2014.

* cited by examiner

ORGANIC ELECTRONIC DEVICE

CROSS-REFERENCE TO RELATED APPLICATION

This application claims priority under 35 U.S.C. 119 to Korean Patent Application No. 10-2012-0006981, filed in the Korean Intellectual Property Office on Jan. 20, 2012, the entire contents of which are incorporated herein by reference.

BACKGROUND

1. Field

Example embodiments herein relate to an organic electronic device.

2. Description of the Related Art

Progressing to an information-oriented society requires developing a new image display device that addresses the drawbacks of the conventional cathode ray tube (CRT) (including heavy weight and/or large volume). Several flat panel displays (e.g., a liquid crystal display (LCD), an organic light emitting diode (OLED) display, a plasma display panel (PDP), a surface-conduction electron-emitter display (SED), and similar devices) are drawing attention.

A thin film transistor (TFT) including a semiconductor layer of amorphous silicon is widely used for a switching device of the flat panel displays.

The amorphous silicon thin film transistor is widely used because it exhibits uniformity and increased electrical characteristics in a doping state, while retaining insulating characteristics in a non-doping state.

However, in order to deposit the conventional amorphous silicon thin film transistor on a substrate, there are limits in carrying out the process at a substantially high temperature of about 300° C. It is relatively difficult to apply the conventional amorphous silicon thin film transistor to a polymer substrate used to form a flexible display.

In order to solve the problems, an organic thin film transistor (OTFT) using an organic semiconductor material has been suggested.

The organic thin film transistor generally includes a substrate, a gate electrode, an insulation layer, a source electrode, a drain electrode, and a channel region. The organic thin film transistor may be classified as a bottom contact (BC) type in which a channel region is formed on the source electrode and the drain electrode or a top contact (TC) type of which a metal electrode is formed on the channel region due to mask deposition.

A low molecular or oligomer organic semiconductor material filled in the channel region of the organic thin film transistor (OTFT) may include merocyanine, phthalocyanine, perylene, pentacene, C60, a thiophene oligomer, and similar compounds. The low molecular, or oligomer, organic semiconductor material may be a thin film formed on the channel region according to a vacuum process.

Organic semiconductor compound materials have workability in that large-area processing is possible using a solution method such as printing techniques at a lower cost.

SUMMARY

Example embodiments relate to an organic electronic device including an organic semiconductor compound having a low bandgap, and increased charge mobility, and being capable of being applied to a solution process.

According to example embodiments, an organic electronic device may include an organic semiconductor represented by the following Chemical Formula 1.

[Chemical Formula 1]

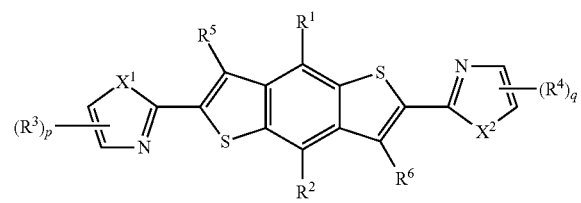

In Chemical Formula 1, $X^1$ and $X^2$ are each independently S, Se, or $NR^a$ (wherein, $R^a$ is selected from hydrogen, a substituted or unsubstituted C1 to C30 linear or branched alkyl group, a substituted or unsubstituted C3 to C30 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group), $R^1$ to $R^4$ are each independently selected from a halogen (—F, —Cl, —Br, or —I), a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, a substituted or unsubstituted C2 to C30 heteroaryl group, —$COR^b$ (wherein $R^b$ is selected from a substituted or unsubstituted C1 to C20 linear or branched alkyl group, a substituted or unsubstituted C3 to C30 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group) and —$C(\!=\!O)OR^c$ (wherein $R^c$ is selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group), $R^5$ and $R^6$ are each independently hydrogen or a C1 to C10 alkyl group, and p and q are integers ranging from 1 to 2.

According to example embodiments, an organic electronic device may include an organic semiconductor compound including a structural unit represented by the following Chemical Formula 2.

[Chemical Formula 2]

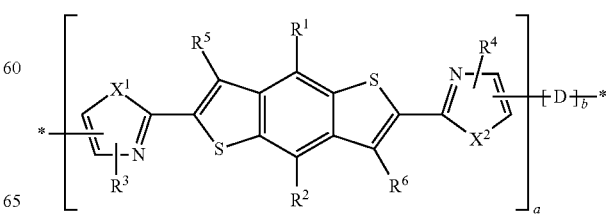

In Chemical Formula 2, $X^1$, $X^2$ and $R^1$ to $R^5$ are the same as in Chemical Formula 1, -D- is a substituted or unsubstituted C1 to C20 alkylene group, a substituted or unsubstituted C4 to C20 aromatic ring, a substituted or unsubstituted C4 to C14 heteroaromatic ring, or a substituted or unsubstituted C6 to C30 condensed polycyclic group including a heteroaromatic ring, and a and b represent a mole ratio of each structural unit, wherein a ranges from about 1 mol % to about 100 mol %, and b ranges from about 0 mol % to about 99 mol %, based on the sum, 100 mol % of a and b.

The -D- structural unit may be one of the structural units represented by the following Chemical Formula 3.

[Chemical Formula 3]

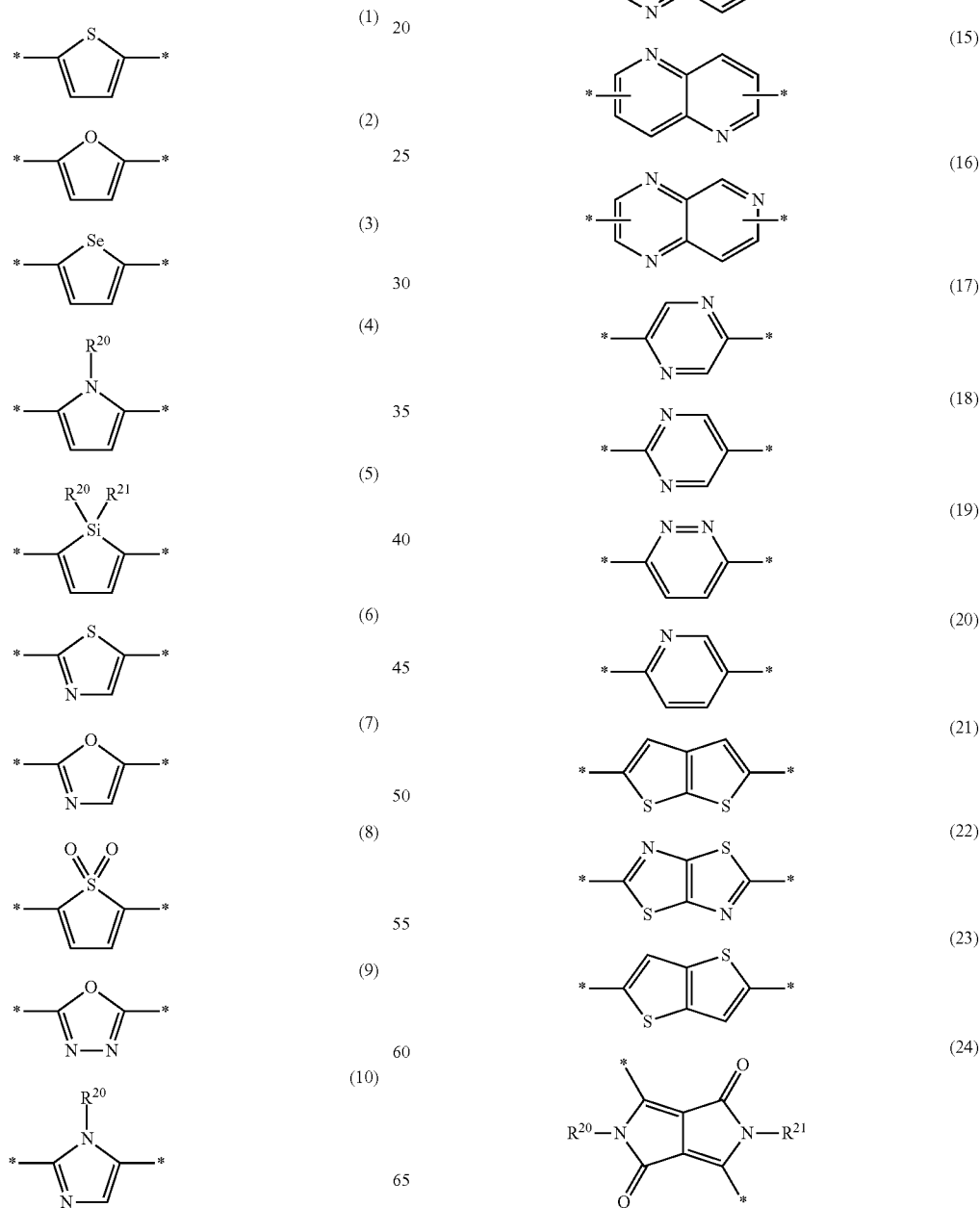

-continued
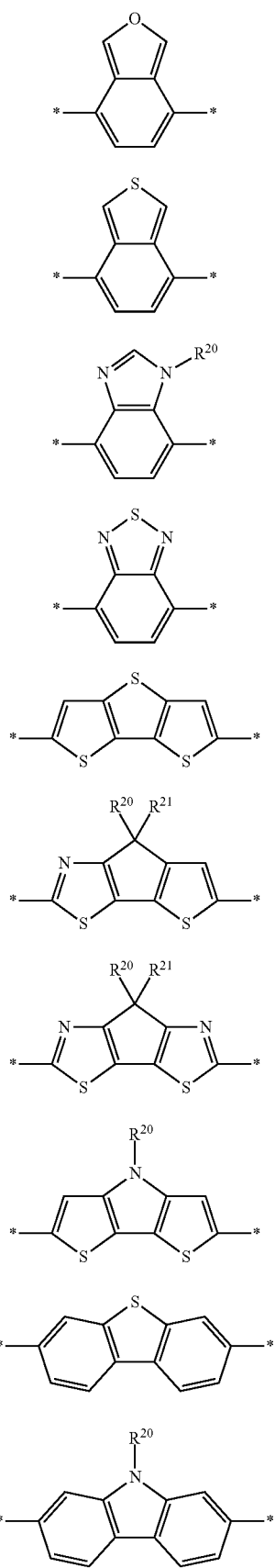
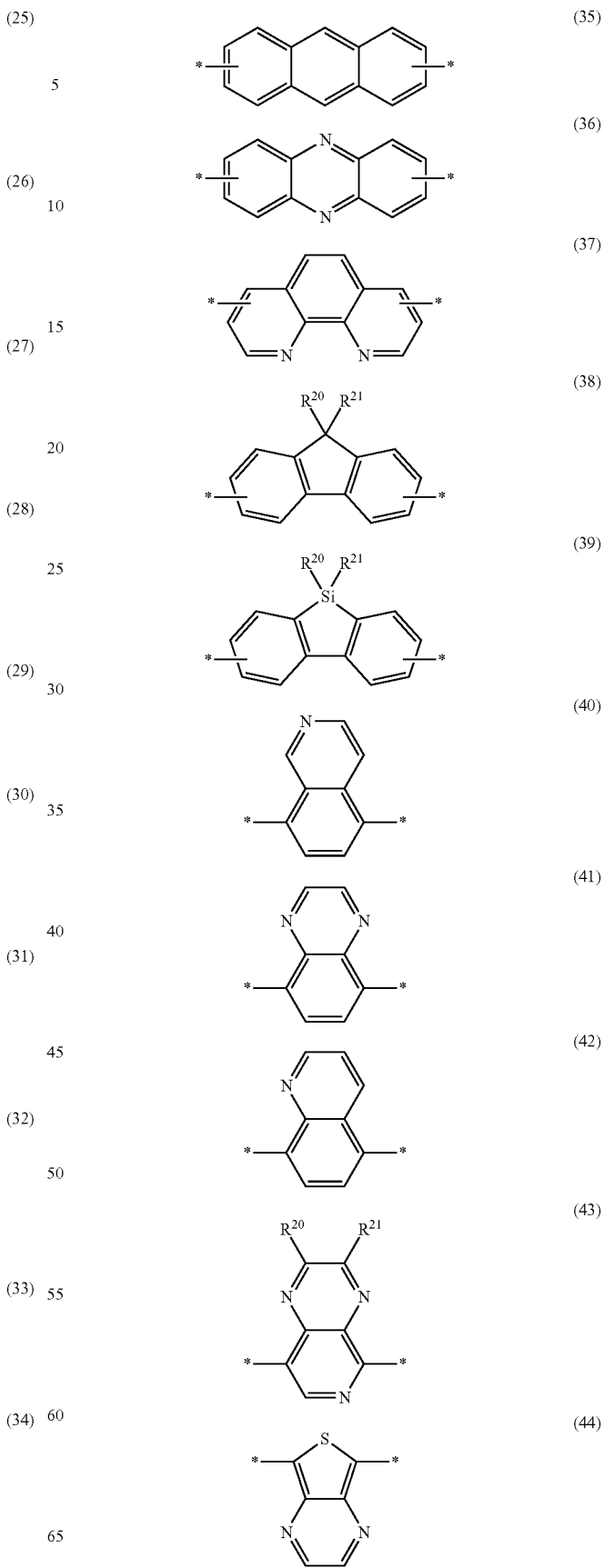

(45) 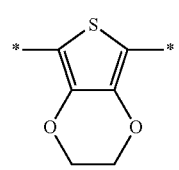
(46) 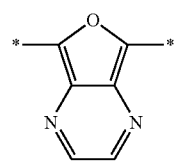
(47) 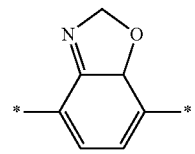
(48) 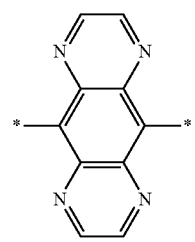
(49) 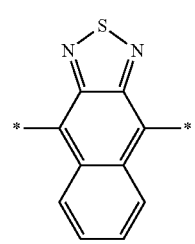
(50) 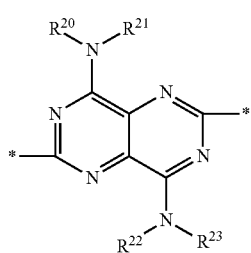
(51) 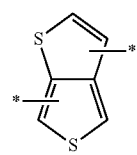
(52) 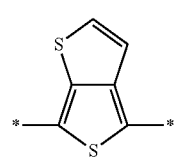
(53) 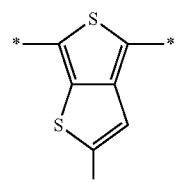
(54) 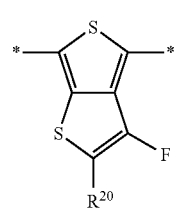
(55) 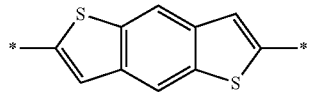
(56) 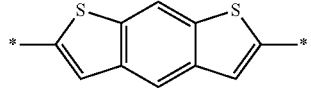
(57) 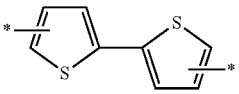
(58) 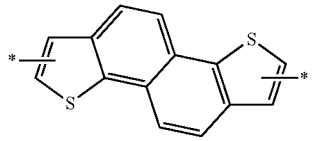
(59) 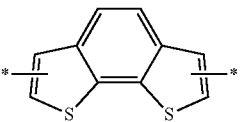
(60) 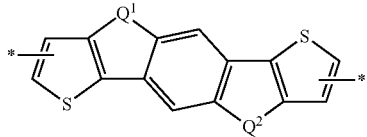
(61) 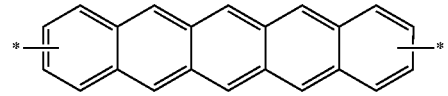
(62) 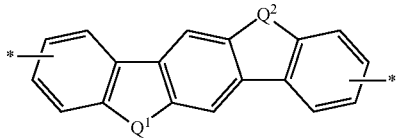
(63)

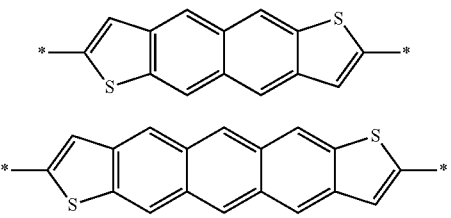

(64)

(65)

In Chemical Formula 3, $R^{20}$ to $R^{23}$ are each independently selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, a substituted or unsubstituted C2 to C30 heteroaryl group, and a combination thereof, and $Q^1$ and $Q^2$ are each independently S, $CR^{24}R^{25}$, $NR^{26}$, or $SiR^{27}R^{28}$, wherein $R^{24}$ to $R^{28}$ are each independently hydrogen, a substituted or unsubstituted C1 to C15 linear or branched alkyl group, a substituted or unsubstituted C3 to C15 cycloalkyl group, a substituted or unsubstituted C1 to C15 alkoxy group, a substituted or unsubstituted C6 to C15 aryl group, a substituted or unsubstituted C2 to C15 heteroaryl group, and a combination thereof.

A hydrogen of —CH— or —$CH_2$— positioned in the aromatic ring or heteroaromatic ring of the above Chemical Formula 3 is optionally substituted with one selected from a fluoro group, a C1 to C10 fluoroalkyl group, a C1 to C20 linear or branched alkyl group, a C3 to C20 cycloalkyl group, a C1 to C20 alkoxy group, a substituted or unsubstituted C6 to C30 aryl group, and a substituted or unsubstituted C2 to C30 heteroaryl group.

The -D- structural unit may be a structural unit represented by the following Chemical Formula 4 including a substituted or unsubstituted thiophene structural unit.

[Chemical Formula 4]

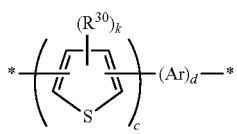

In Chemical Formula 4, $R^{30}$ is selected from hydrogen, a substituted or unsubstituted C4 to C20 aromatic ring, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, k is an integer ranging from 1 to 2, —Ar— is a substituted or unsubstituted C4 to C20 aromatic ring, a substituted or unsubstituted C4 to C14 heteroaromatic ring, or a substituted or unsubstituted C6 to C30 condensed polycyclic group including a heteroaromatic ring, and c and d represent a mole ratio of each structural unit, wherein c ranges from about 1 mol % to about 99 mol %, and d ranges from about 1 mol % to from about 99 mol % based on the sum, 100 mol % of c and d.

The —Ar— of the Chemical Formula 4 may be one of the above structural units represented by Chemical Formula 3.

The organic semiconductor compound represented by Chemical Formula 1 or Chemical Formula 2 may include one of terminal functional groups represented by the following Chemical Formulas 5 to 8.

[Chemical Formula 5]

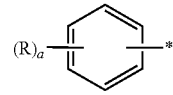

In Chemical Formula 5,

R is a fluoro group or a C1 to C20 perfluoroalkyl group, and a is an integer ranging from 1 to 5.

[Chemical Formula 6]

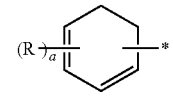

In Chemical Formula 6,

R is a fluoro group or a C1 to C20 perfluoroalkyl group, and a is an integer ranging from 1 to 6.

[Chemical Formula 7]

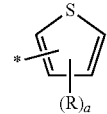

In Chemical Formula 7,

R is a fluoro group or a C1 to C20 perfluoroalkyl group, and a is an integer ranging from 1 to 3.

[Chemical Formula 8]

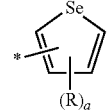

In Chemical Formula 8,

R is a fluoro group or a C1 to C20 perfluoroalkyl group, and a is an integer ranging from 1 to 3.

The organic semiconductor compound represented by Chemical Formula 1 may include organic semiconductor compounds represented by the following Chemical Formula 9, and the organic semiconductor compound represented by Chemical Formula 2 may include organic semiconductor compounds including one of structural units represented by the following Chemical Formula 10.

[Chemical Formula 9]

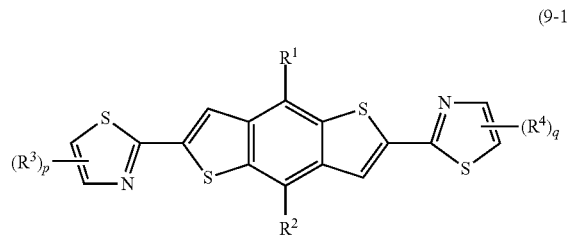

(9-1)

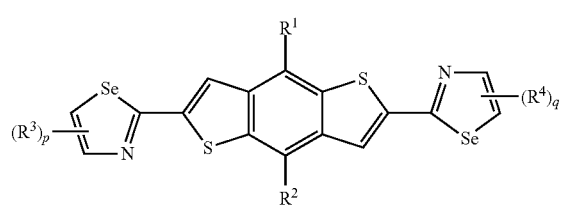

(9-2)

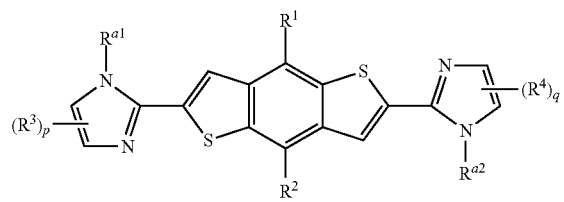

(9-3)

In Chemical Formula 9, $R^1$ to $R^4$ are the same as in Chemical Formula 1, $R^{a1}$ to $R^{a2}$ are selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, and p and q are integers ranging from 1 to 2.

[Chemical Formula 10]

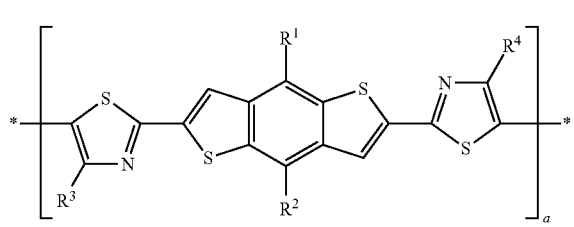

(10-1)

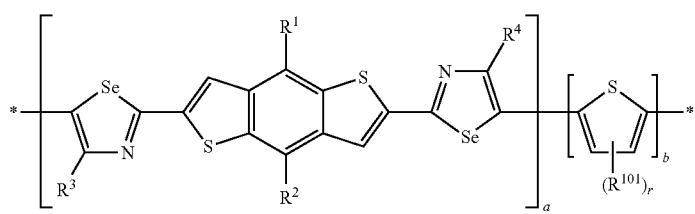

(10-2)

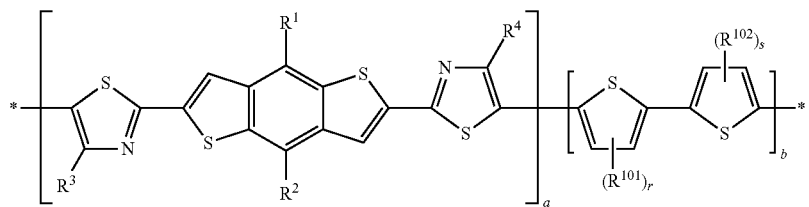

(10-3)

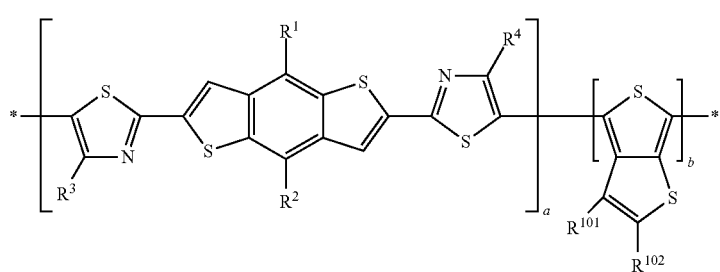

(10-4)

-continued
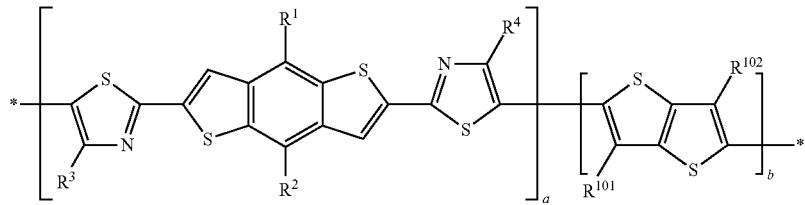
(10-5)
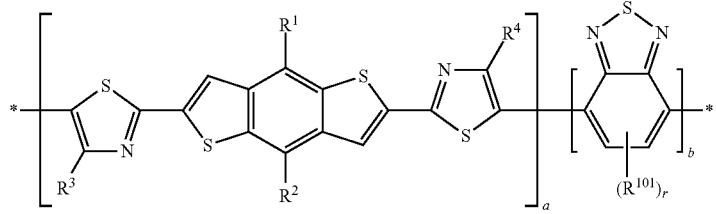
(10-6)
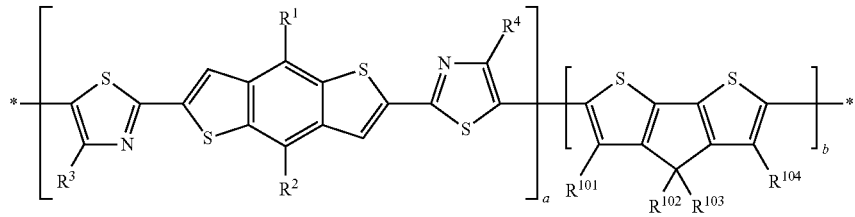
(10-7)
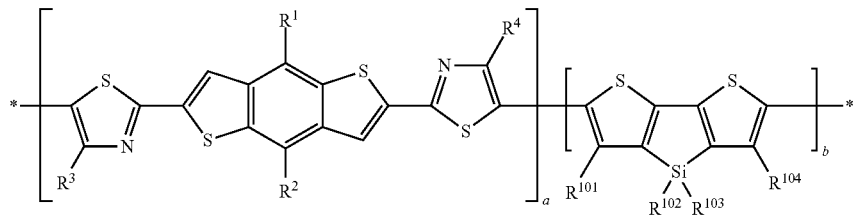
(10-8)
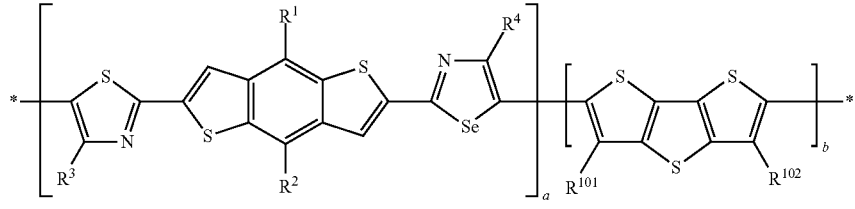
(10-9)
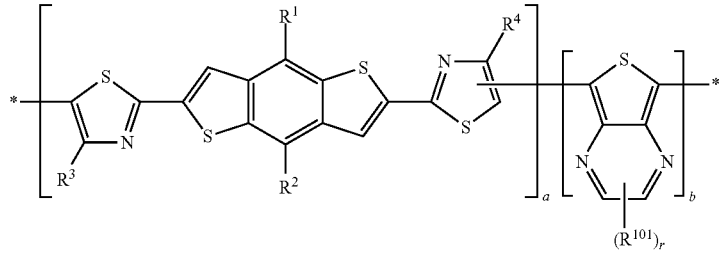
(10-10)
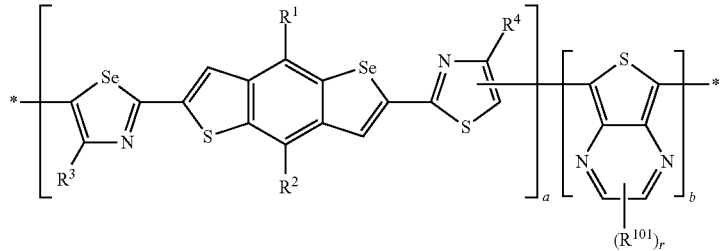
(10-11)

-continued (10-12)
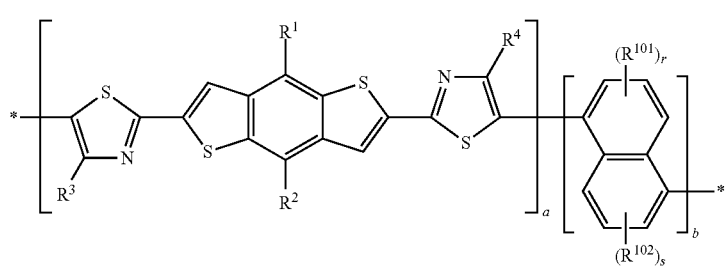

(10-13)
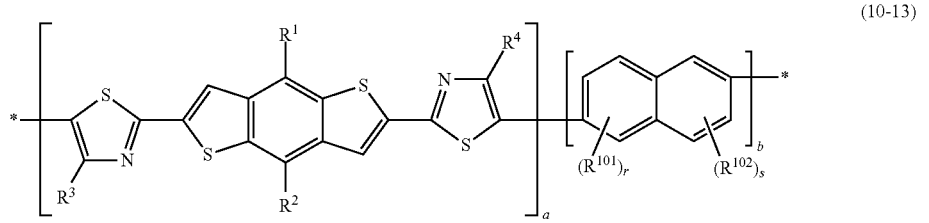

(10-14)
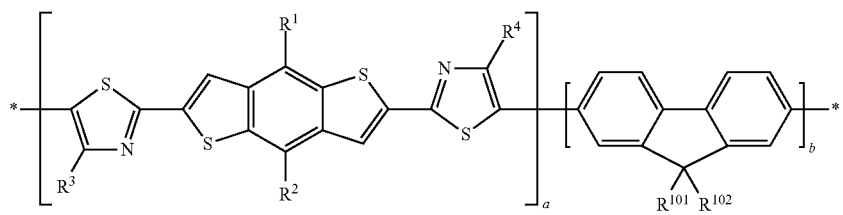

(10-15)
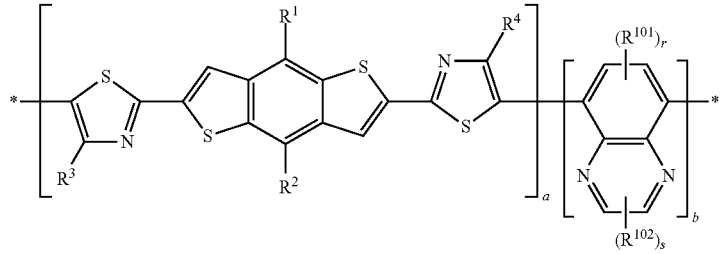

In Chemical Formula 10, $R^1$ to $R^4$ are the same as in Chemical Formula 1

$R^{101}$ and $R^{102}$ are each independently selected from hydrogen, a substituted or unsubstituted C4 to C20 aromatic ring, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, r and s are integers ranging from 1 to 2, and a and b represent a mole ratio of each structural unit, wherein a ranges from about 1 mol % to about 100 mol %, and b ranges from about 0 mol % to about 99 mol %, based on the sum, 100 mol % of a and b.

The organic electronic device may be selected from a transistor, a solar cell, a memory device, an organic light emitting diode (OLED), a photosensor, and a laser device.

The transistor may include a gate electrode disposed on a substrate; a source electrode and a drain electrode facing each other and defining a channel region; an insulation layer electrically insulating the source electrode and drain electrode and the gate electrode; and an active layer including the organic semiconductor compound formed in the channel region.

Hereinafter, various example embodiments will be described in further detail.

DETAILED DESCRIPTION

Figure 1:
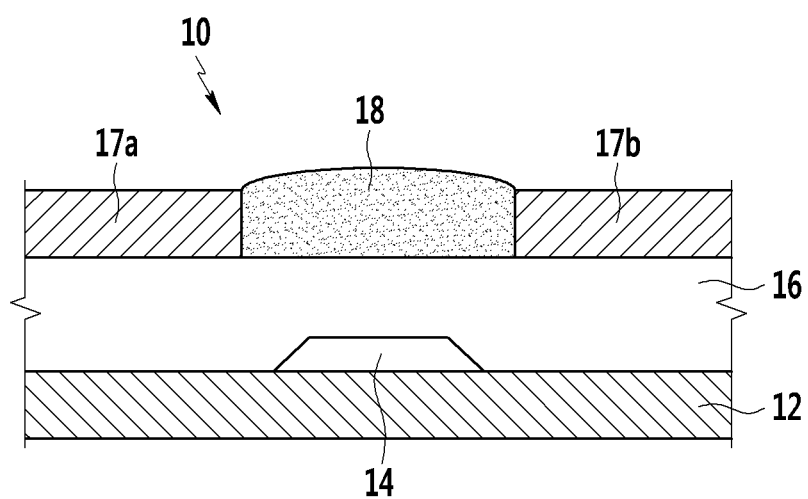
FIG. 1 is a schematic cross-sectional view of a transistor according to example embodiments.

This disclosure will be described more fully hereinafter with reference to the accompanying drawings, in which various example embodiments are shown. This disclosure may, however, be embodied in many different forms and is not be construed as limited to the example embodiments set forth herein.

It will be understood that when an element such as a layer, film, or substrate is referred to as being "on" another element, it can be directly on the other element or intervening elements may also be present. In contrast, when an element is referred to as being "directly on" another element, there are no intervening elements present.

As used herein, the term "combination thereof" refers to a mixture, a stacked structure, a composite, an alloy, or the like.

As used herein, when a definition is not otherwise provided, the term "hetero" may refer to one including 1 to 4 heteroatoms selected from N, O, S, Se, Si, and P, with the remaining structural atoms being carbons. The total number of ring members may be 3 to 10. If multiple rings are present, each ring is independently aromatic, saturated, or partially unsaturated, and multiple rings, if present, may be fused, pendant, spirocyclic, or a combination thereof. The term "heterocycloalkyl group" may refer to at least one non-aromatic ring including a heteroatom, and the term "heteroaryl group" may refer to at least one aromatic ring including a heteroatom. Non-aromatic and/or carbocyclic rings may also be present in a heteroaryl group, provided that at least one ring is both aromatic and contains a ring member that is a heteroatom.

As used herein, when a definition is not otherwise provided, the term "alkyl group" may refer to a linear or branched, saturated, monovalent hydrocarbon group (e.g., a methyl group, an ethyl group, a propyl group, an isobutyl group, a sec-butyl group, a tert-butyl group, a pentyl group, an iso-amyl group, a hexyl group, and the like).

The term "alkoxy group" may refer to an alkyl group that is linked via an oxygen, e.g., a methoxy group, an ethoxy group, and a sec-butyloxy group.

The term "aryl group" may refer to a monovalent functional group formed by the removal of one hydrogen atom from one or more rings of an arene, e.g., phenyl or naphthyl. The arene may refer to a hydrocarbon having an aromatic ring, and includes monocyclic and polycyclic hydrocarbons wherein the additional ring(s) of the polycyclic hydrocarbon may be aromatic or nonaromatic.

The term "aryloxy group" may refer to an aryl group that is linked via an oxygen, and the aryl group is the same as described above.

The "arylalkyl group" may refer to an aryl group where at least one hydrogen is substituted with a lower alkylene, e.g., methylene, ethylene, propylene, and the like. For example, the "arylalkyl group" may be a benzyl group or a phenylethyl group.

The term "cycloalkyl group" may refer to a monovalent functional group having one or more saturated rings in which all ring members are carbon, e.g., a cyclopentyl group and a cyclohexyl group.

As used herein, when a definition is not otherwise provided, "aromatic ring" refers to a functional group in which all atoms in the cyclic functional group have a p-orbital, wherein these p-orbitals are conjugated. For example, the aromatic ring may be a C6 to C20 aryl group.

As used herein, when a definition is not otherwise provided, the term "heteroaromatic ring" refers to a functional group including 1 to 4 heteroatoms selected from N, O, and S in a ring in which all atoms in the cyclic functional group have a p-orbital, wherein the p-orbital is conjugated. For example, the heteroaromatic ring may be a C2 to C30 heteroaryl group, a C3 to C30 heterocycloalkenyl group, or a C3 to C30 heterocycloalkynyl group.

The term "condensed polycyclic group" may refer to a fused ring including the foregoing heteroaromatic ring linked to at least one ring selected from a C3 to C30 cycloalkyl group, a C3 to C30 cycloalkenyl group, a C2 to C30 heterocycloalkyl group, a C2 to C30 heteroaryl group, and a C3 to C30 heterocycloalkenyl group.

As used herein, when a definition is not otherwise provided, the term "substituted" may mean that a functional group or a compound is substituted with at least one substituent selected independently from a halogen (—F, —Cl, —Br, or —I), a C1 to C30 linear or branched alkyl group, for example a C1 to C10 linear or branched alkyl group, a C2 to C30 linear or branched alkenyl group, for example a C2 to C10 linear or branched alkenyl group, a C2 to C30 linear or branched alkynyl group, for example a C2 to C10 linear or branched alkynyl group, C6 to C30 aryl group, for example a C6 to C12 aryl group, a C2 to C30 heteroaryl group, for example a C2 to C12 heteroaryl group, a C3 to C30 cycloalkyl group, a C1 to C20 fluoroalkyl group, a C1 to C20 perfluoroalkyl group (CnF2n+1, wherein n is an integer ranging from 1 to 20), a C1 to C30 linear or branched alkoxy group, a C3 to C30 cycloalkyloxy group, a C2 to C30 linear or branched alkoxyalkyl group, a C4 to C30 cycloalkyloxyalkyl group, a cyano group, an amino group (—NRR', wherein R and R' are independently hydrogen or a C1 to C10 alkyl group), an amidino group (—C(=NH)NH2), a nitro group (—NO2), an amide group (—C(=O)N(H)R, wherein R is hydrogen or a C1 to C10 alkyl group), an aldehyde group (—C(=O)H), a hydroxy group (—OH), a sulfonyl group (—S(=O)2R, wherein R is independently hydrogen or a C1 to C10 alkyl group), and a carbamate group (—NH2COOR, wherein R is a C1 to C10 alkyl group), instead of hydrogen, provided that the substituted atom's normal valence is not exceeded.

According to example embodiments, an organic electronic device may include an organic semiconductor compound represented by the following Chemical Formula 1.

[Chemical Formula 1]

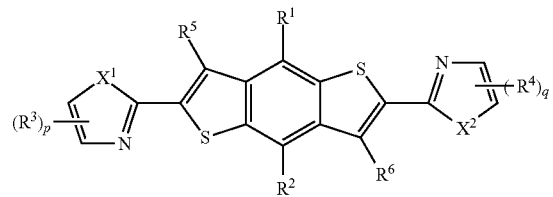

In Chemical Formula 1, $X^1$ and $X^2$ are each independently S, Se, or $NR^a$ (wherein, $R^a$ is selected from hydrogen, a substituted or unsubstituted C1 to C30 linear or branched alkyl group, a substituted or unsubstituted C3 to C30 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group), $R^1$ to $R^4$ are each independently selected from a halogen (—F, —Cl, —Br, or —I), a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, a substituted or unsubstituted C2 to C30 heteroaryl group, —$COR^b$ (wherein $R^b$ is selected from a substituted or unsubstituted C1 to C20 linear or branched alkyl group, a substituted or unsubstituted C3 to C30 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group) and —$C(=O)OR^c$ (wherein $R^c$ is selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group), $R^5$ and $R^6$ are each independently hydrogen or a C1 to C10 alkyl group, and p and q are integers ranging from 1 to 2.

When p and q are 2, a plurality of $R^3$ and $R^4$ may be the same or different.

The organic semiconductor compound represented by the above Chemical Formula 1 may have a structure in which functional groups (a thiazolyl group, an oxazolyl group, a selenazolyl group, or an imidazolyl group) having an aromatic ring structure of N-included rings are symmetrically bound at the ends in the center of benzo[1,2-b:4,5-b'] dithiophene structure. The organic semiconductor compound having the structure has excellent coplanarity to provide a condensed film having a strong intermolecular stacking property. Thereby, the charge mobility of intermolecular/among molecules may be improved, and the interrupt current may be decreased by adjusting the energy level.

In addition, by introducing a C8 to C30 long aliphatic unsaturated hydrocarbon chain group (e.g., a substituted or unsubstituted C8 to C30 alkyl group) into at least one of $R^1$ and $R^2$ in Chemical Formula 1, the dissolubility of the organic semiconductor compound in the organic solvent may be improved. The dissolubility improvement may enable simple coating even by a solution process at room temperature (about 23° C. to about 25° C.) and provide a thin film having wide area, which is effective in the view of processibility and workability. When a saturated hydrocarbon chain group is present instead of an unsaturated hydrocarbon chain group, the dissolubility to the solvent is so deteriorated that the film is hardly formed, and the stability to light may be deteriorated.

n Chemical Formula 1, $R^3$ and $R^4$ may each independently be a thiazolyl group, an oxazolyl group, a selenazolyl group, or an imidazolyl group. Herein, the term "combination thereof" may refer to a group including at least two functional groups selected from the thiazolyl group, oxazolyl group, selenazolyl group, and imidazolyl group that are linked to each other through a single bond. In this case, a conjugation structure is extended and thus bandgap energy may be reduced.

According to example embodiments, an organic electronic device may include an organic semiconductor compound that includes a structural unit represented by the following Chemical Formula 2 and that is obtained by polymerizing the organic semiconductor compound represented by Chemical Formula 1.

[Chemical Formula 2]

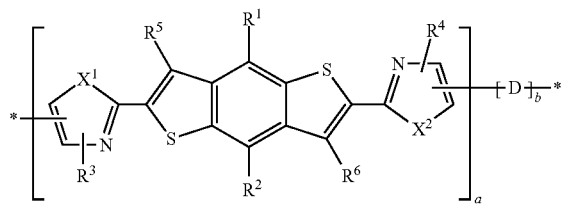

In Chemical Formula 2, $X^1$, $X^2$, and $R^1$ to $R^5$ are the same as in Chemical Formula 1, -D- is a substituted or unsubstituted C1 to C20 alkylene group, a substituted or unsubstituted C4 to C20 aromatic ring, a substituted or unsubstituted C4 to C14 heteroaromatic ring, or a substituted or unsubstituted C6 to C30 condensed polycyclic group including a heteroaromatic ring, and a and b represent a mole ratio of each structural unit, wherein a ranges from about 1 mol % to about 100 mol %, and b ranges from about 0 mol % to about 99 mol %, based on the sum, 100 mol %, of a and b.

For example, a may range from about 1 mol % to about 90 mol %, and b may range from about 10 mol % to about 99 mol %. In another example, a may range from about 1 mol % to about 80 mol %, and b may range from about 20 mol % to about 99 mol %.

The -D- structural unit may be one of the structural units represented by the following Chemical Formula 3.

[Chemical Formula 3]

(1)
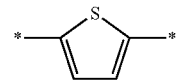

(2)
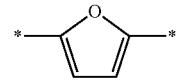

(3)
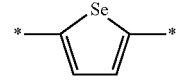

(4)
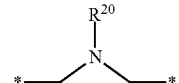

(5)
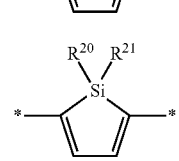

(6)
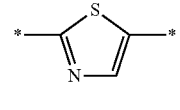

(7)
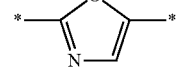

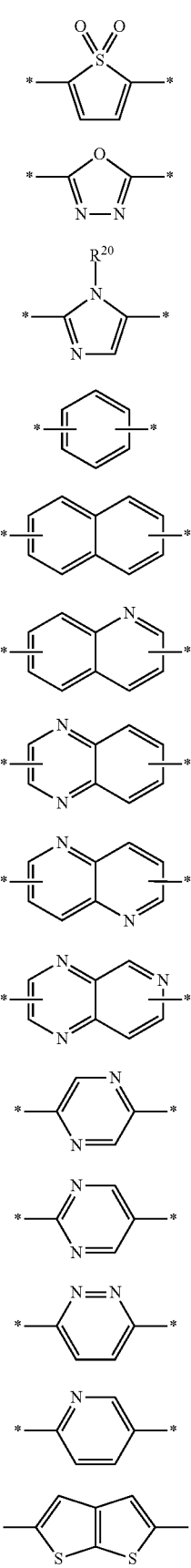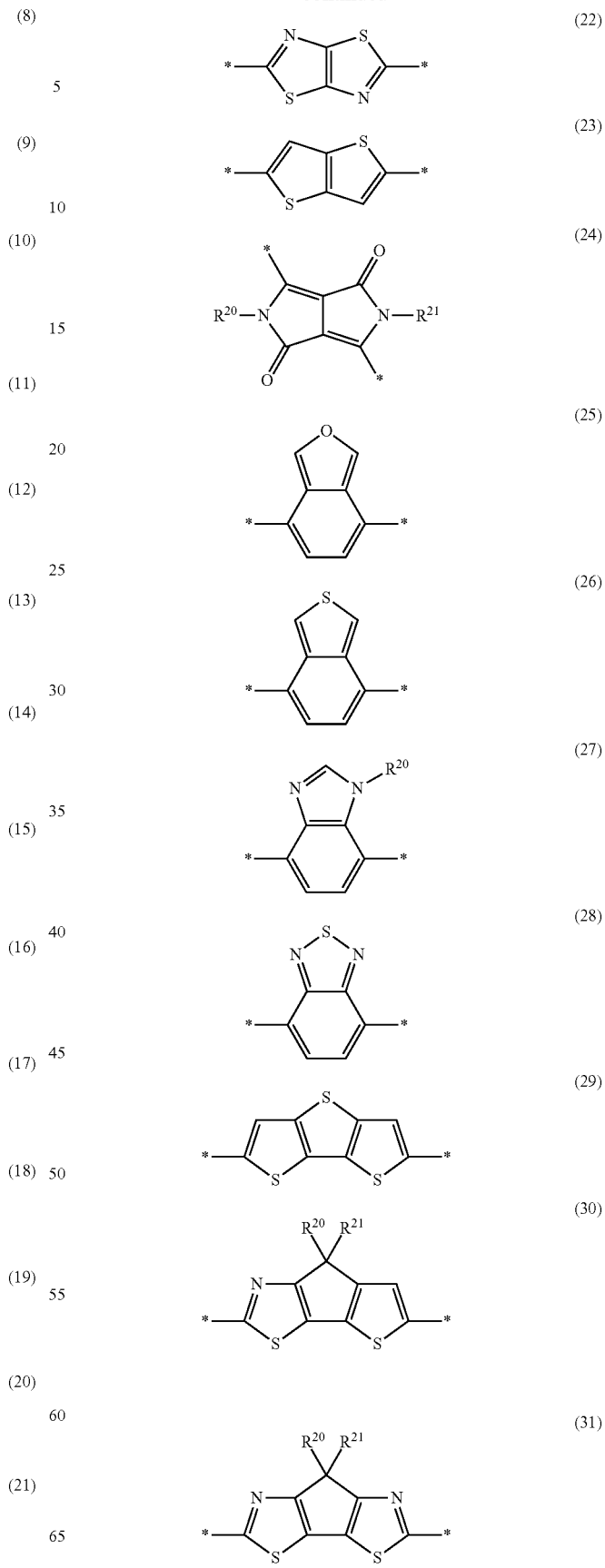

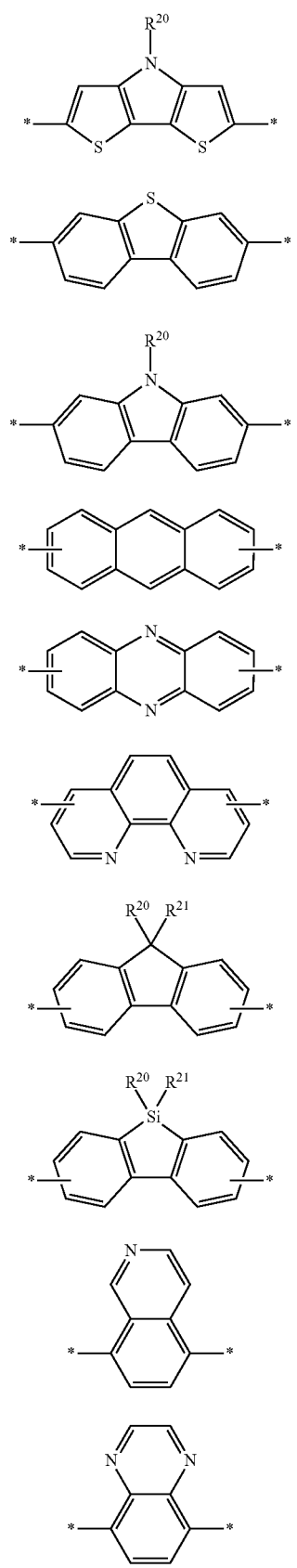
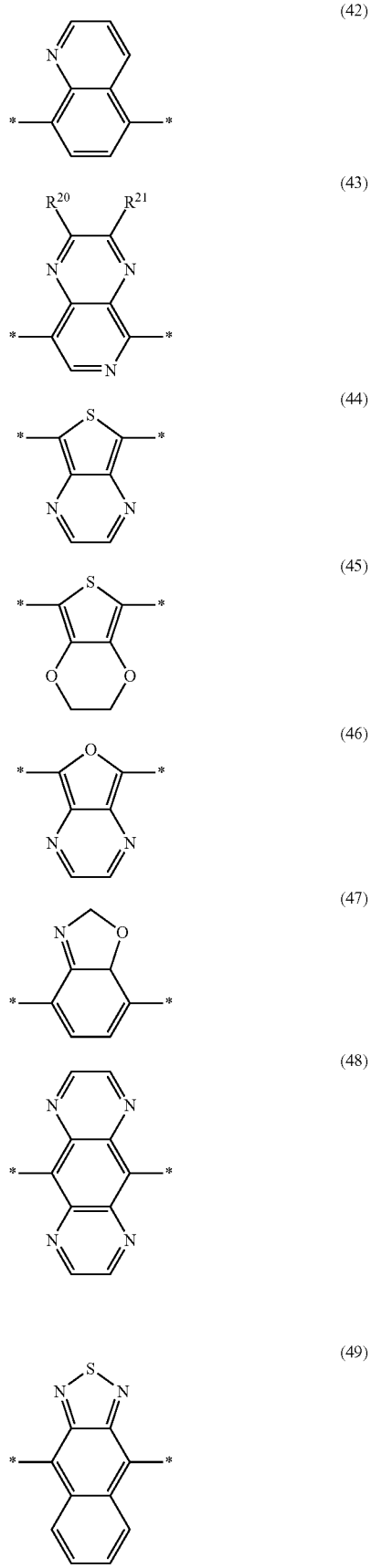

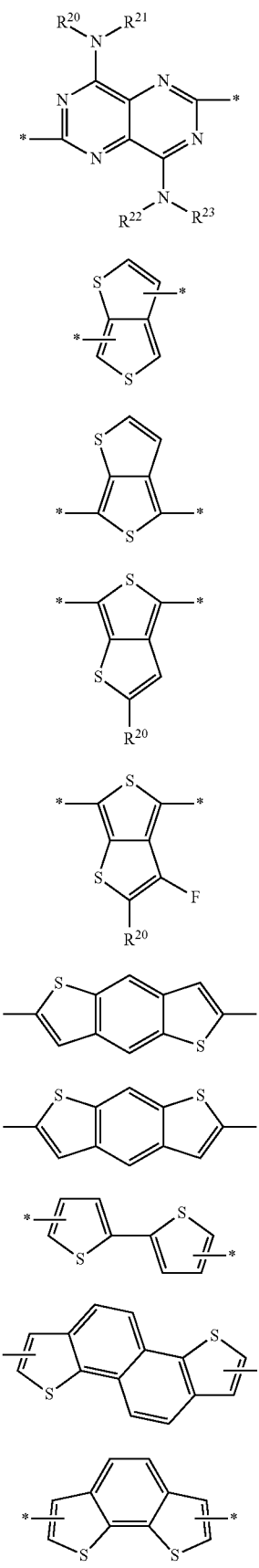

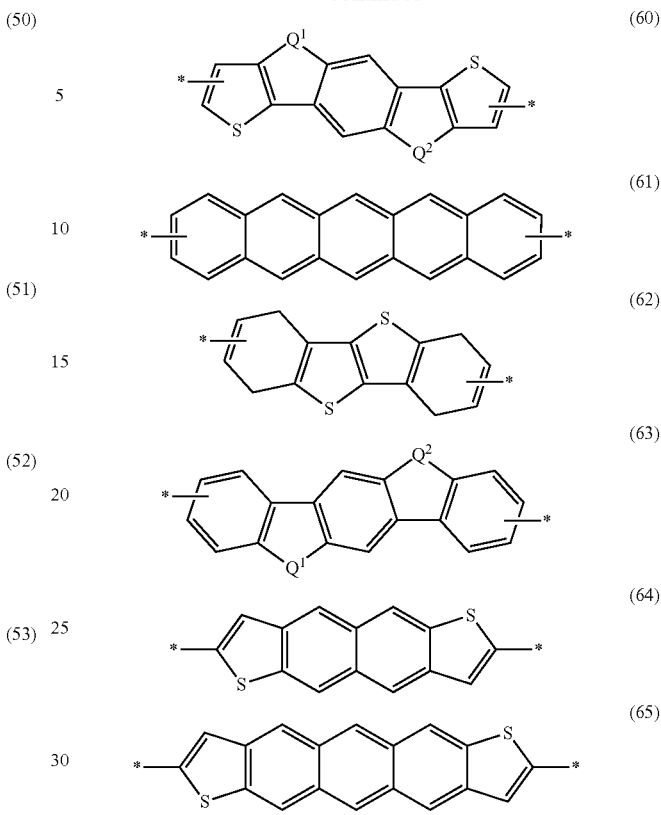

In Chemical Formula 3,
$R^{20}$ to $R^{23}$ are each independently selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, $Q^1$ and $Q^2$ are each independently S, $CR^{24}R^{25}$, $NR^{26}$, or $SiR^{27}R^{28}$, wherein $R^{24}$ to $R^{28}$ are each independently selected from hydrogen, a substituted or unsubstituted C1 to C15 linear or branched alkyl group, a substituted or unsubstituted C3 to C15 cycloalkyl group, a substituted or unsubstituted C1 to C15 alkoxy group, a substituted or unsubstituted C6 to C15 aryl group, a substituted or unsubstituted C2 to C15 heteroaryl group, and a combination thereof, and a hydrogen of —CH— or —CH$_2$— positioned in the aromatic ring or heteroaromatic ring of the above Chemical Formula 3 is optionally substituted with one selected from a fluoro group, a C1 to C10 fluoroalkyl group, a C1 to C20 linear or branched alkyl group, a C3 to C20 cycloalkyl group, a C1 to C20 alkoxy group, a substituted or unsubstituted C6 to C30 aryl group, and a substituted or unsubstituted C2 to C30 heteroaryl group.

The organic semiconductor compound represented by Chemical Formula 2 includes a first structural unit derived from the organic semiconductor compound represented by the Chemical Formula 1 and a second structural unit represented by -D-. The first structural unit and the second structural unit may be arranged as a block unit, alternately arranged, or randomly arranged.

The second structural unit may be a structural unit represented by the following Chemical Formula 4 including a substituted or unsubstituted thiophene structural unit.

[Chemical Formula 4]

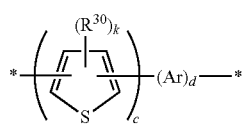

In Chemical Formula 4, $R^{30}$ is selected from hydrogen, a substituted or unsubstituted C4 to C20 aromatic ring, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, k is an integer ranging from 1 to 2, —Ar— is a substituted or unsubstituted C4 to C20 aromatic ring, a substituted or unsubstituted C4 to C14 heteroaromatic ring, or a substituted or unsubstituted C6 to C30 condensed polycyclic group including a heteroaromatic ring, and c and d represent a mole ratio of each structural unit, wherein c ranges from about 1 mol % to about 99 mol %, and d ranges from about 1 mol % to about 99 mol % based on the sum, 100 mol %, of c and d. For example, c may range from about 1 mol % to about 80 mol %, and d may range from about 20 mol % to about 99 mol %. The $-A_3-$ of the Chemical Formula 4 may be one of the above structural units represented by Chemical Formula 3.

In Chemical Formula 4, a substituted or unsubstituted thiophene structural unit and an —Ar— structural unit may be arranged as a block unit, alternately arranged, or randomly arranged.

The organic semiconductor compound of the above Chemical Formula 1 or Chemical Formula 2 may include one of terminal functional groups represented by the following Chemical Formulas 5 to 8.

[Chemical Formula 5]

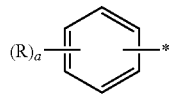

In Chemical Formula 5,

R is a fluoro group or a C1 to C20 perfluoroalkyl group, and a is an integer ranging from 1 to 5.

[Chemical Formula 6]

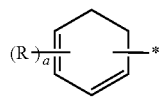

In Chemical Formula 6,

R is a fluoro group or a C1 to C20 perfluoroalkyl group, and a is an integer ranging from 1 to 6.

[Chemical Formula 7]

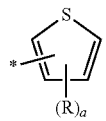

In Chemical Formula 7,

R is a fluoro group or a C1 to C20 perfluoroalkyl group, and a is an integer ranging from 1 to 3.

[Chemical Formula 8]

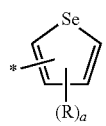

In Chemical Formula 8,

R is a fluoro group or a C1 to C20 perfluoroalkyl group, and a is an integer ranging from 1 to 3.

The organic semiconductor compound represented by Chemical Formula 1 may be organic semiconductor compounds represented by the following Chemical Formula 9.

[Chemical Formula 9]

(9-1)

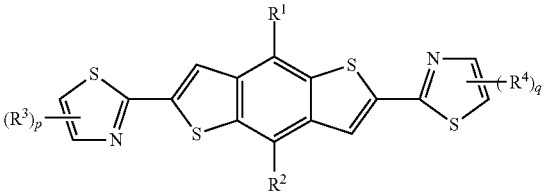

(9-2)

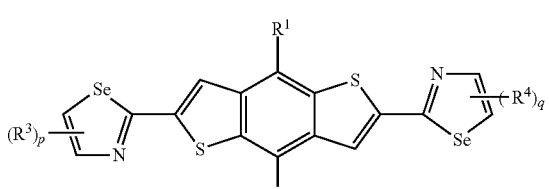

(9-3)

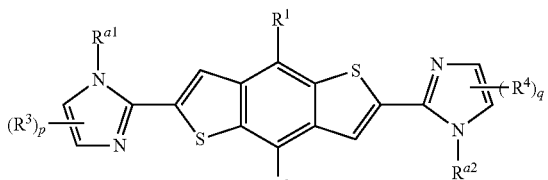

In Chemical Formula 9, $R^1$ to $R^4$ are the same as in Chemical Formula 1, $R^{a1}$ to $R^{a2}$ are selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, and p and q are integers ranging from 1 to 2.

When p and q are 2, a plurality of $R^3$ and $R^4$ may be the same or different.

For example, the organic semiconductor compound represented by Chemical Formula 1 may be organic semiconductor compounds represented by the following Chemical Formula 9A.

[Chemical Formula 9a]

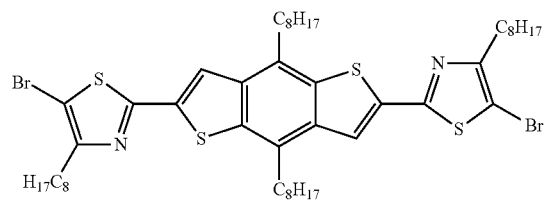

(9A-1)

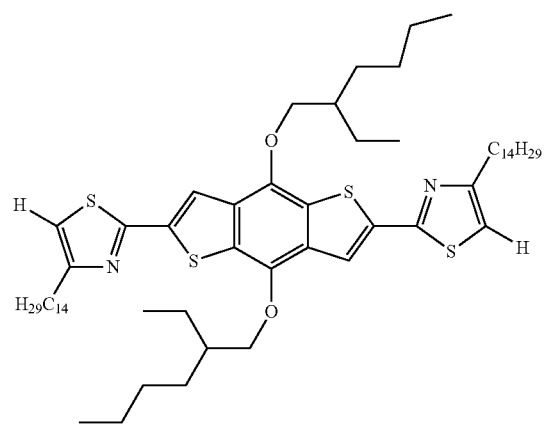

(9A-2)

(9A-3)

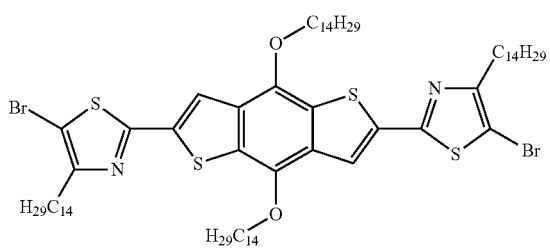

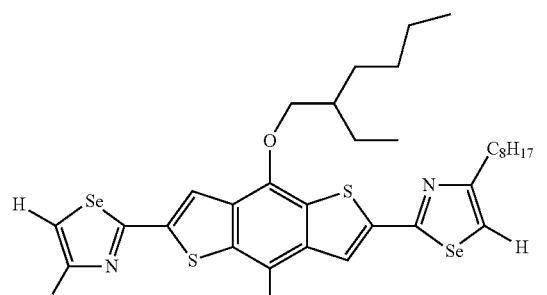

(9A-4)

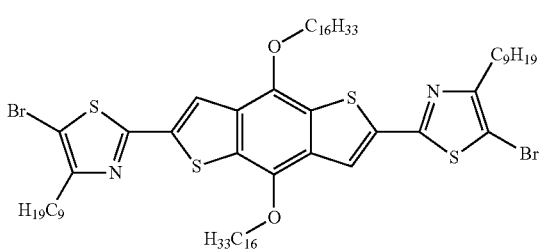

(9A-5)

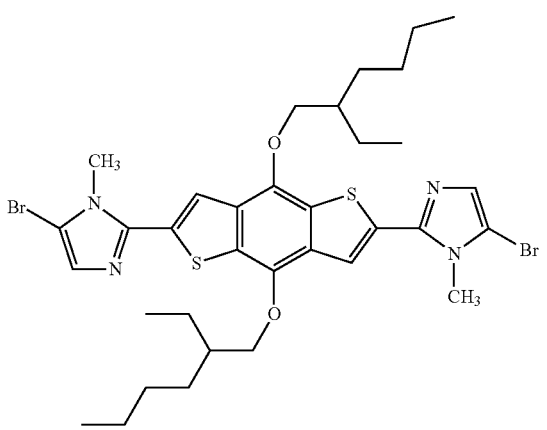

(9A-6)

For example, the organic semiconductor compound represented by Chemical Formula 2 may be organic semiconductor compounds including one of structural units represented by the following Chemical Formula 10.

[Chemical Formula 10]

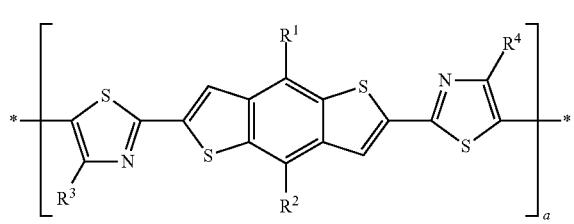

(10-1)

(10-2)
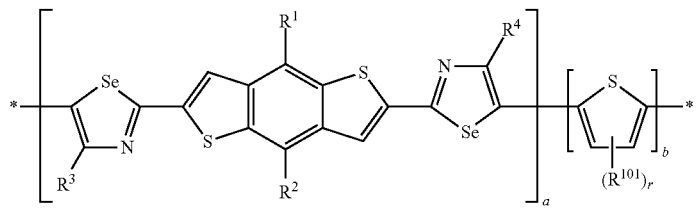
(10-3)
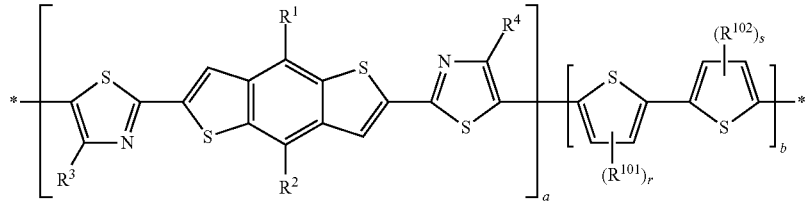
(10-4)
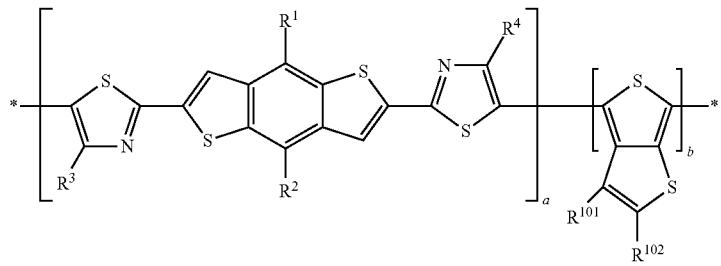
(10-5)
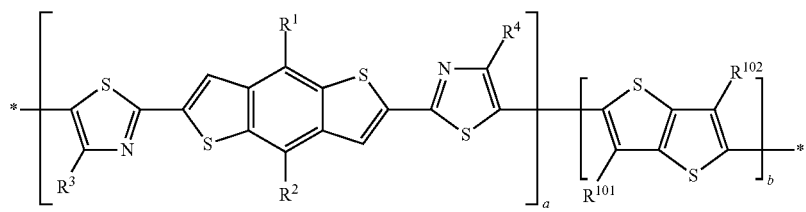
(10-6)
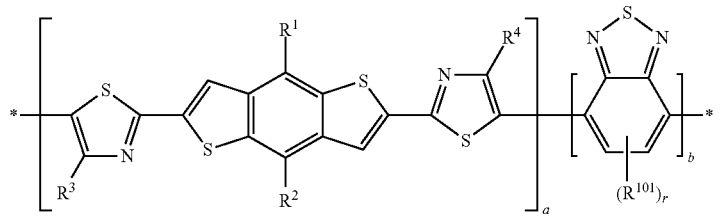
(10-7)
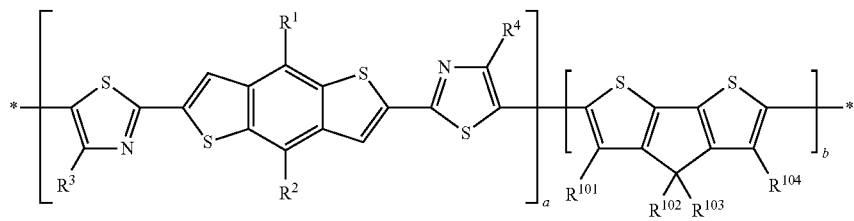
(10-8)
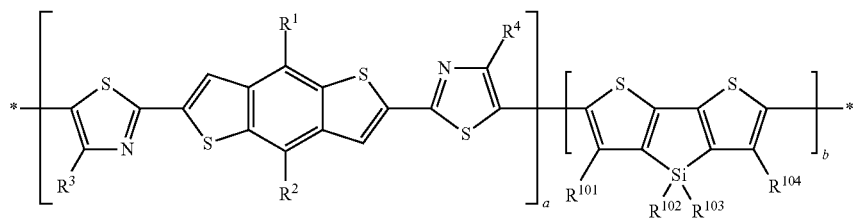

-continued
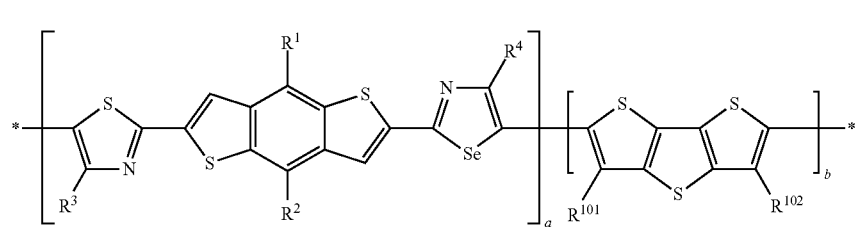
(10-9)
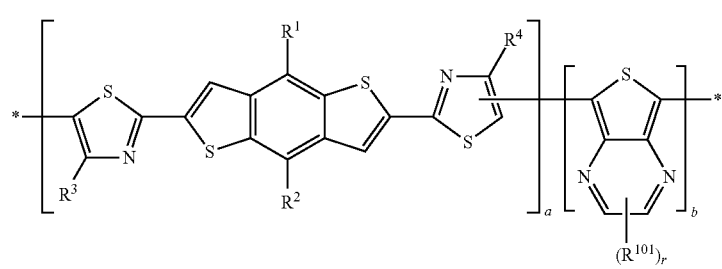
(10-10)
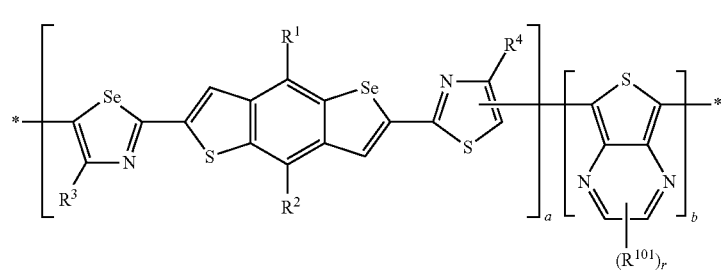
(10-11)
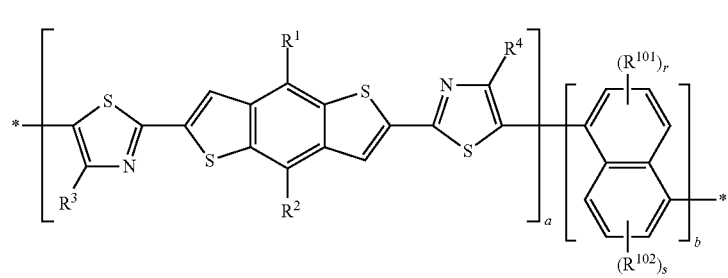
(10-12)
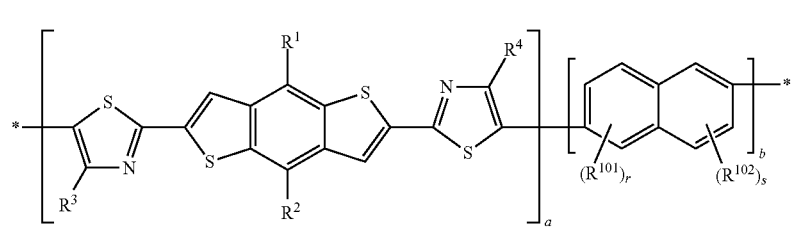
(10-13)
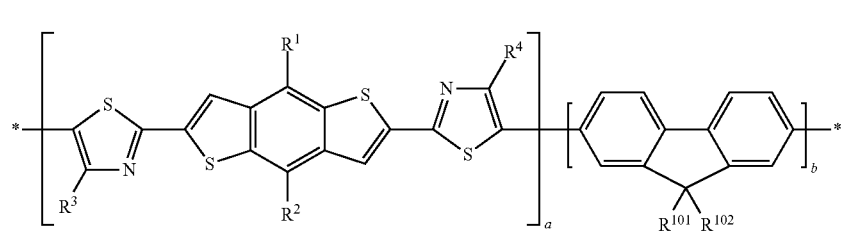
(10-14)

(10-15)

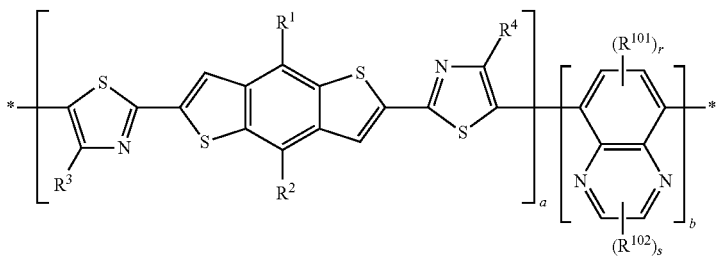

In Chemical Formula 10,
R$^1$ to R$^4$ are the same as in Chemical Formula 1,
R$^{101}$ and R$^{102}$ are each independently selected from hydrogen, a substituted or unsubstituted C4 to C20 aromatic ring, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, r and s are integers ranging from 1 to 2, and
a and b represent a mole ratio of each structural unit, wherein a ranges from about 1 mol % to about 100 mol %, and b ranges from about 0 mol % to about 99 mol %, based on the sum, 100 mol %, of a and b.

When r and s are 2, a plurality of R$^{101}$ and R$^{102}$ may be the same or different.

For example, the organic semiconductor compound represented by Chemical Formula 2 may be organic semiconductor compounds represented by the following Chemical Formula 10A.

[Chemical Formula 10A]

(10A-1)

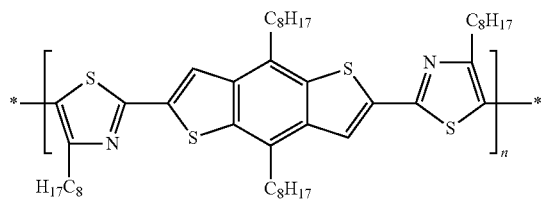

(10A-2)

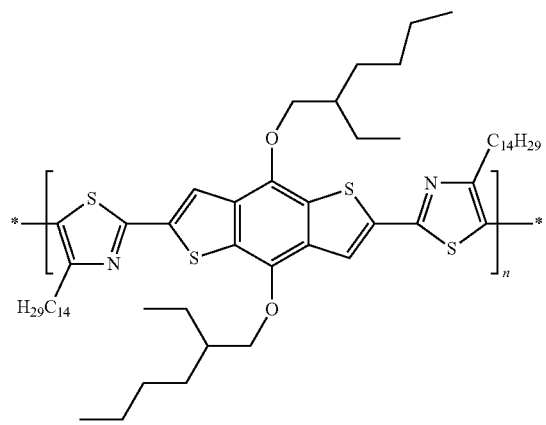

(10A-3)

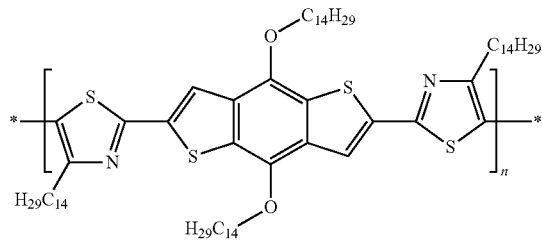

(10A-4)

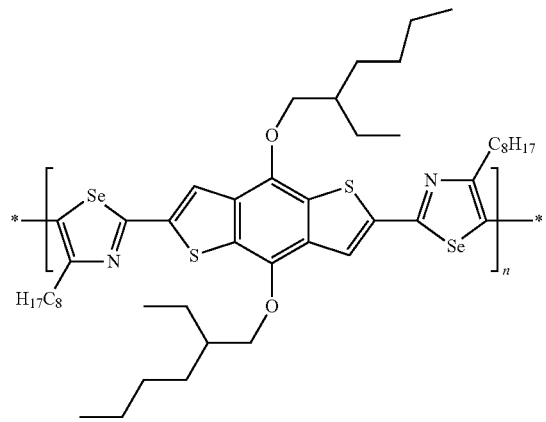

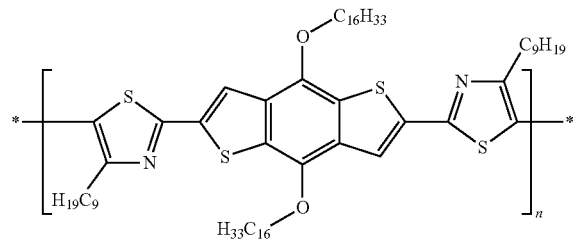
(10A-5)

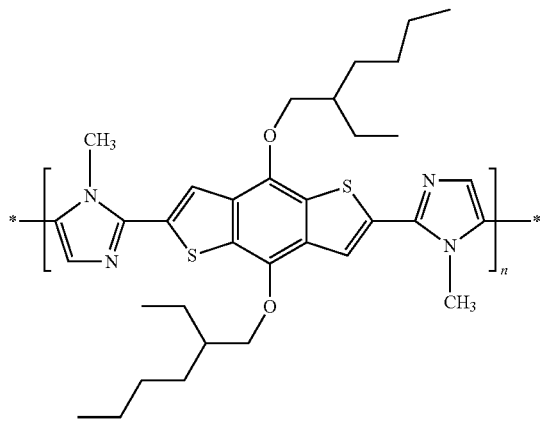
(10A-6)

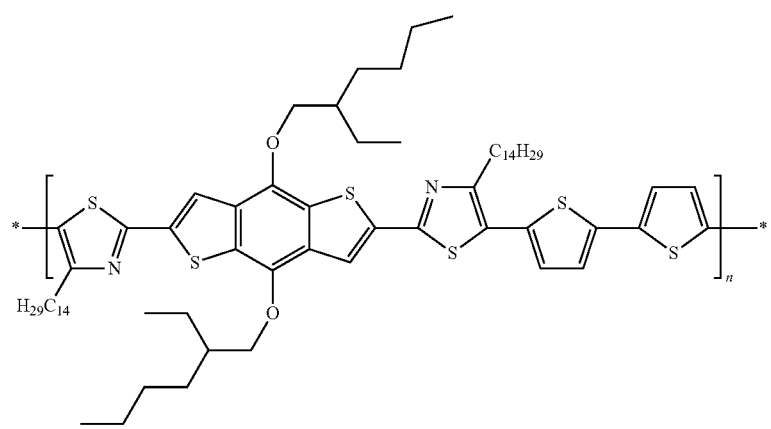
(10A-7)

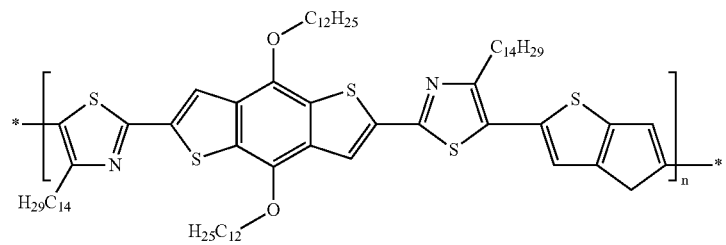
(10A-8)

In Chemical Formula 10A, n refers to a degree of polymerization of a polymer, and specifically ranges from 5 to 100.

The organic semiconductor compound represented by Chemical Formula 2 may be an organic semiconductor oligomer or polymer having a number average molecular weight (Mn) of about 5000 to about 100,000. When the organic semiconductor compound has the number average molecular weight within the range, the dissolubility to the organic solvent may be appropriately controlled to provide a thin film having excellent characteristics.

The organic semiconductor compound of the Chemical Formula 1 may be obtained by reacting three monomers of monomer (1), monomer (2), and monomer (3) as shown in the following Reaction Scheme 1.

[Reaction Scheme 1]

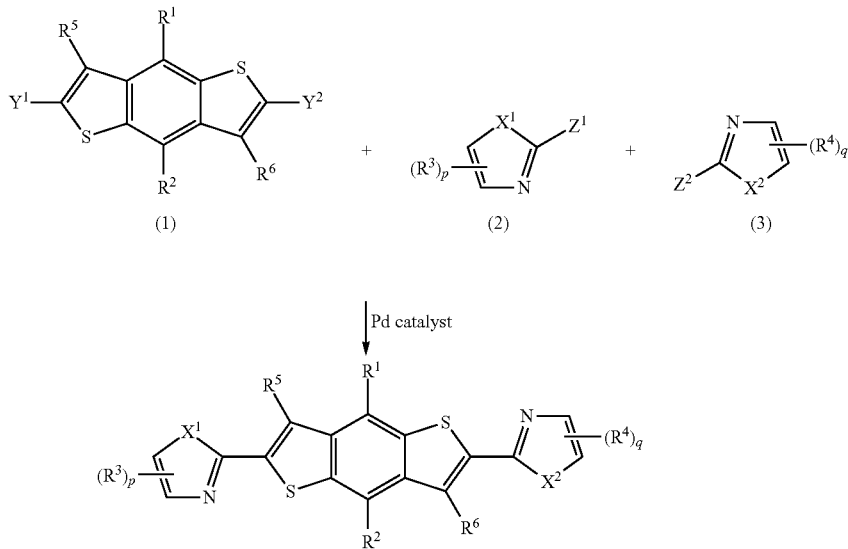

In Reaction Scheme 1, $X^1$, $X^2$, $R^1$ to $R^5$, p, and q are the same as in Chemical Formula 1, $Y^1$ and $Y^2$ are each independently —Sn(CH$_3$)$_3$, —Sn(C$_4$H$_9$)$_3$, or —B(OR)$_2$ (wherein R is hydrogen or a C1 to C10 alkyl group), and $Z^1$ and $Z^2$ are each independently —Sn(CH$_3$)$_3$, —Sn(C$_4$H$_9$)$_3$, or —B(OR)$_2$ (wherein R is hydrogen or a C1 to C10 alkyl group), —Br, or —I.

The organic semiconductor compound including the structural unit represented by Chemical Formula 2 may be synthesized as shown in Reaction Scheme 2 according to known methods.

[Reaction Scheme 2]

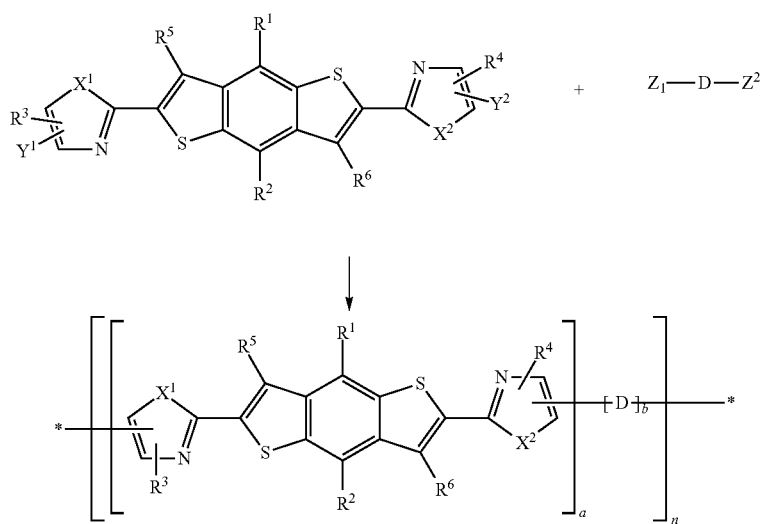

In Reaction Scheme 2, $X^1$, $X^2$, and $R^1$ to $R^5$ are the same as in Chemical Formula 1, -D-, a, and b are the same as in Chemical Formula 2, $Y^1$ and $Y^2$ are each independently —Sn(CH$_3$)$_3$, —Sn(C$_4$H$_9$)$_3$, or —B(OR)$_2$ (wherein R is hydrogen or a C1 to C10 alkyl group), $Z^1$ and $Z^2$ are each independently —Sn(CH$_3$)$_3$, —Sn(C$_4$H$_9$)$_3$, or —B(OR)$_2$ (wherein R is hydrogen or a C1 to C10 alkyl group), —Br, or —I, and n represents a degree of polymerization.

The organic semiconductor compounds of the above Chemical Formulas 1 and 2 may provide an organic thin film which may be applied to an organic semiconductor layer, or a carrier transport layer such as a channel layer for an organic electronic device. The electronic device including the same may have excellent electrical properties such as high charge mobility as well as excellent processibility and workability.

The organic thin film may be fabricated by depositing the organic semiconductor compound of the organic semiconductor compounds of the above Chemical Formulas 1 and 2 on a substrate according to the general method, or alternatively dissolving the organic semiconductor compound in an organic solvent and then coating the same on a substrate at room temperature (about 23° C. to about 25° C.) according to a solution process. Since the organic semiconductor compound may provide an organic thin film using a solution process, a large-area device may be fabricated at a reduced manufacturing cost of devices.

Particularly, the organic solvent may include at least one kind of general organic solvent, for example, at least one kind of an aliphatic hydrocarbon solvent such as hexane, heptane, or the like; an aromatic hydrocarbon solvent such as toluene, pyridine, quinoline, anisole, mesitylene, xylene, or the like; a ketone-based solvent such as methyl isobutyl ketone, 1-methyl-2-pyrrolidinone, cyclohexanone, acetone, or the like; an ether-based solvent such as tetrahydrofuran, isopropyl ether, or the like; an acetate-based solvent such as ethyl acetate, butyl acetate, propylene glycol methyl ether acetate, or the like; an alcohol-based solvent such as isopropyl alcohol, butanol, or the like; an amide-based solvent such as dimethyl acetamide, dimethyl formamide, or the like; a silicone-based solvent; and a mixture of solvents. The amount of the organic semiconductor compound dissolved in the organic solvent may be adequately selected and determined by a person of ordinary skill in the art, for example, in a range of about 0.01 wt % to about 50 wt % in the total solvent in the view of solubility and coating property.

The method of providing an organic thin film may include thermal deposition, vacuum deposition, laser deposition, screen printing, printing, imprinting, spin casting, dipping, ink jetting, roll coating, flow coating, drop casting, spray coating, roll printing, or the like, but is not limited thereto. The heat treatment may be performed at about 80 to about 250° C. for about 1 minute to about 2 hours, but is not limited thereto.

The thickness of the organic thin film may be adjusted according to the usage and the case considering the kinds of the used compound and solvent by a person of ordinary skill in the art, and is preferably in a range of about 200 Å to about 10,000 Å.

The organic electronic device may be selected from a transistor, a solar cell, a memory device, an organic light emitting diode (OLED), a photosensor, and a laser device.

Figure 2:
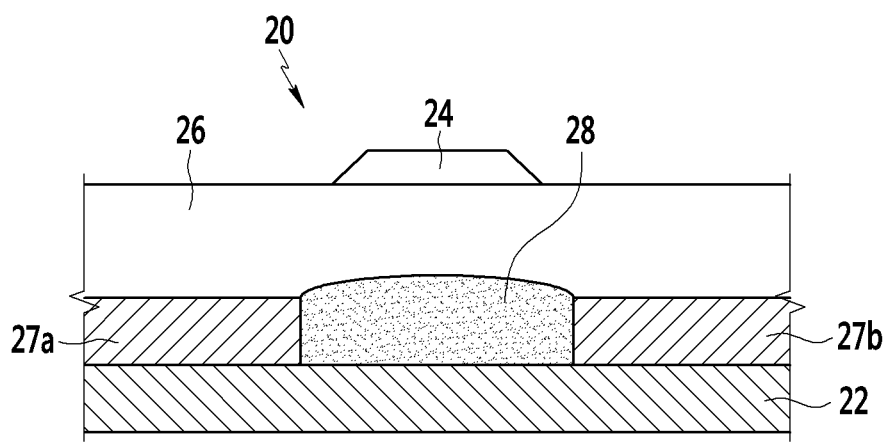
FIG. 2 is a schematic cross-sectional view of another transistor according to example embodiments.

FIGS. 1 and 2 are schematic cross-sectional views showing transistors according to example embodiments. The transistor may be a thin film transistor. The thin film transistor may include a thin film with a thickness of several nm to several μm.

Referring to FIG. 1, a transistor 10 may include a substrate 12, a gate electrode 14 disposed on the substrate, and an insulation layer 16 covering the gate electrode 14. On the insulation layer 16, a source electrode 17a and a drain electrode 17b defining a channel region are provided, and an active layer 18 is provided in the channel region. The active layer 18 includes an organic semiconductor compound.

Referring to FIG. 2, in a transistor 20, a source electrode 27a and a drain electrode 27b defining a channel region are formed on a substrate 22, and an active layer 28 is formed on the channel region. The active layer 28 includes an organic semiconductor compound. An insulation layer 26 is formed to cover the source electrode 27a, the drain electrode 27b, and the active layer 28, and a gate electrode 24 is formed thereon.

The substrates 12 and 22 may include an inorganic material, an organic material, or a composite of an inorganic material and an organic material. The organic material may include, for example, a plastic such as polyethylenenaphthalate (PEN), polyethyleneterephthalate (PET), polycarbonate, polyvinylalcohol, polyacrylate, polyimide, polynorbornene, and polyethersulfone (PES), and the inorganic material may include, for example, glass or metal.

In addition, the gate electrodes 14 and 24, source electrodes 17a and 27a, and drain electrodes 17b and 27b may include a generally-used metal, particularly, gold (Au), silver (Ag), aluminum (Al), nickel (Ni), or indium tin oxide (ITO), but it is not limited thereto.

The insulation layers 16 and 26 may include a generally-used insulator having a high dielectric constant, particularly a ferroelectric insulator such as $Ba_{0.33}Sr_{0.66}TiO_3$ (BST, barium strontium titanate), $Al_2O_3$, $Ta_2O_5$, $La_2O_5$, $Y_2O_3$, $TiO_2$, and the like; an inorganic insulator such as $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $SiO_2$, $SiN_x$, AlON and the like; or an organic insulator such as polyimide, benzocyclobutane (BCB), parylene, polyacrylate, polyvinylalcohol, polyvinylphenol, and the like, but it is not limited thereto. Although not aforementioned, the inorganic insulator disclosed in U.S. Pat. No. 5,946,551 and the organic insulator disclosed in U.S. Pat. No. 6,232,157 may be used for the insulation layers 16 and 26, the entire disclosures of which are incorporated herein by reference.

The organic semiconductor compound is applicable for a memory device, an organic light emitting diode (OLED), a photosensor, a laser device, and the like.

Figure 3:
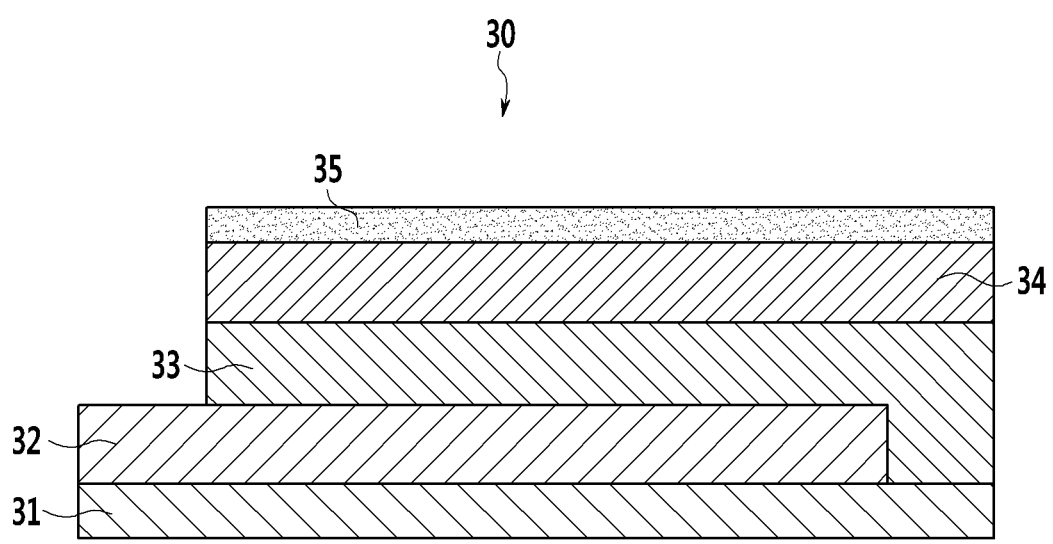
FIG. 3 is a schematic cross-sectional view showing an organic solar cell according to example embodiments.

Hereinafter, an organic solar cell according to example embodiments is illustrated referring to FIG. 3. FIG. 3 provides a schematic cross-sectional view showing an organic solar cell according to example embodiments.

Referring to FIG. 3, the organic solar cell 30 includes an anode 32 on a substrate 31.

The substrate 31 may be made of any transparent material allowing an external light to be entered without any particular limit. Accordingly, the transparent substrate 31 may be made of glass or plastics. Examples of the plastic may include polyethyleneterephthalate (PET), polyethylene naphthalate (PEN), polycarbonate (PC), polypropylene (PP), polyimide (PI), triacetyl cellulose (TAC), a copolymer thereof, or the like.

The anode 32 may be made of a material with high work function for hole injection for example, a transparent oxide such as indium tin oxide (ITO), fluorine tin oxide (FTO), indium oxide, and the like.

On the anode 32, a hole transport layer (HTL) 33 may be disposed. The hole transport layer (HTL) 33 may include a conductive polymer such as poly(3,4-ethylenedioxythiophene) (PEDOT) doped with poly(styrenesulfonate) (PSS) (PEDOT:PSS), polyaniline doped with poly(styrenesulfonic acid) (PAni:PSS), polypyrrole, poly(p-phenylenevinylene), poly[2-methoxy-5-(2'-ethyl-hexyloxy)-1,4-phenylene vinylene](MEH-PPV), poly[2-methoxy-5-(3,7-dimethyloctyloxy)-1,4-phenylene-vinylene) (MDMO-PPV), poly(3-alkylthiophene), polythiophene, and the like; pentacene; CuPc; or a triphenyldiamine derivative (TPD).

On the hole transport layer (HTL) 33, a photoactive layer 34 may be disposed. The photoactive layer may include an electron donor (p-type semiconductor) material and an electron accepter (n-type semiconductor) material. The electron donor may be selected from the above-described organic semiconductor compounds. The electron acceptor may include fullerene with large electron affinity (C60, C70, C74, C76, C78, C82, C84, C720, C860); a fullerene derivative such as 1-(3-methoxy-carbonyl)propyl-1-phenyl(6,6)C61 (PCBM); or a mixture thereof.

The organic semiconductor compound and the electron acceptor may be mixed in the photoactive layer 34 or form a bilayered photoactive layer 34 including two separate thin films. The organic semiconductor compound and a carbon-based material may be mixed in a weight ratio of about 1:0.5 to about 1:4. When the organic semiconductor compound and the carbon-based material are mixed within the range, efficiency of an organic solar cell may be improved. The photoactive layer 34 may be formed in a common method of coating the mixture of an organic semiconductor compound and an electron acceptor, for example, spraying, spin coating, dipping, printing, doctor-balding, sputtering, and the like and may have a thickness ranging from about 5 nm to about 2000 nm.

On the photoactive layer 34, a cathode 35 is disposed. The cathode 35 may be made of an alkali metal such as lithium (Li), sodium (Na), and the like; an alkali-earth metal such as beryllium (Be), magnesium (Mg), and the like; aluminum (Al); transition elements such as silver (Ag), gold (Au), cobalt (Co), iridium (Ir), nickel (Ni), osmium (Os), palladium (Pd), platinum (Pt), and the like; a rare earth element; a semi-metal such as selenium (Se), and the like; a metal alloy such as a sodium-potassium alloy, a magnesium-indium alloy, an aluminum-lithium alloy, and the like; LiF/Al, and the like. Although not shown in the drawing, an electron transport layer (ETL) may be further formed between the photoactive layer 34 and cathode 35.

On the other hand, a photocurrent is generated when a light is absorbed in the photoactive layer 34 and excites a pair of electron-hole, the excited pair of electron-hole are diffused and reach a interface of an electron-acceptor and an electron-donor and then, separated into electrons and holes due to electron affinity difference of two materials at the interface, the electrons move through the electron acceptor to a cathode 35 while the hole move through the electron-donor to an anode 32.

Hereinafter, various embodiments are illustrated in more detail with reference to the following examples. However, the following are merely example embodiments and are not limiting.

EXAMPLE 1

Synthesis of organic semiconductor compound (7, monomer)

[Reaction Scheme 3]

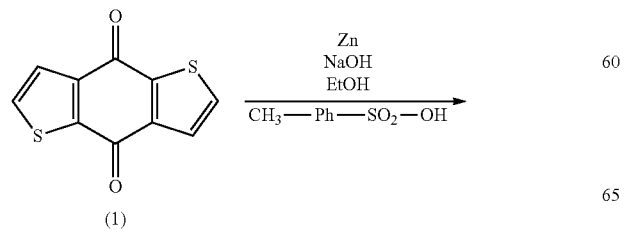

(1)

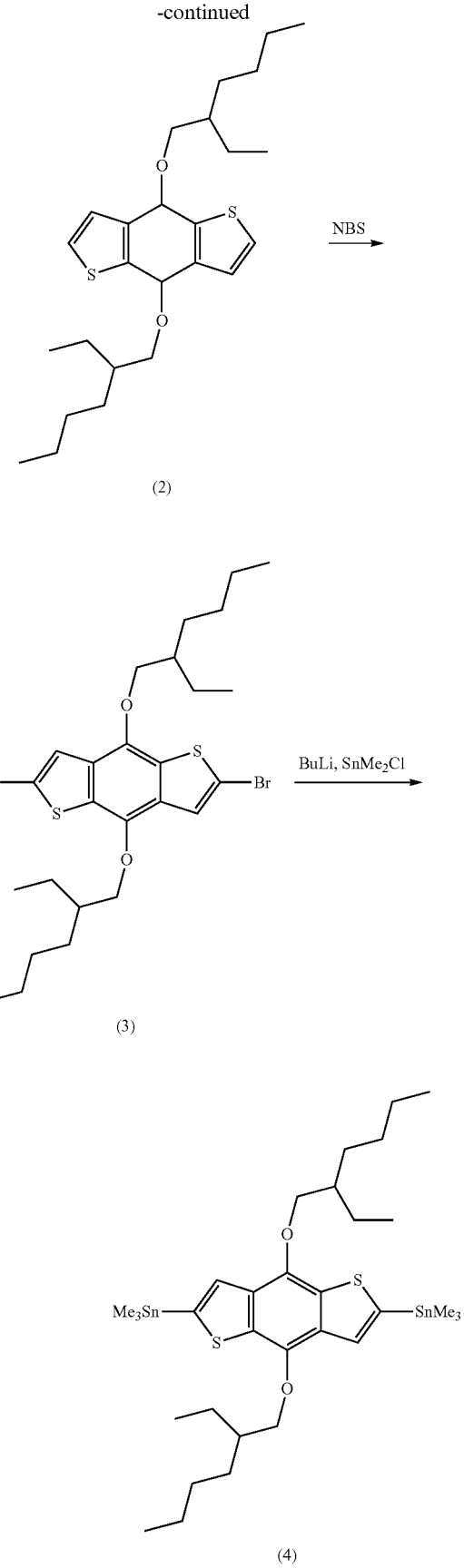

(2)

(3)

(4)

SYNTHESIS EXAMPLE 1A

Synthesis of compound (2) (4,8-bis (2-ethylhexyloxy)benzo[1,2-b:4,5-b']dithiophene)

NaOH (6 g) is added into a mixture of compound (1) (2.2 g, 10 mmol), Zn powder (1.5 g, 22 mmol), and water (50 ml). The obtained mixture is agitated at 100° C. for 1 hour and added with 1-bromo-2-ethylhexane (30 mmol) and a catalyst amount (1 mol based on 100 mol of monomer) of tetrabutylammonium bromide, and then further reacted for 6 hours. The obtained reaction mixture is introduced into cold water and extracted by diethylether two times to provide an organic layer. The organic layer is dried using $MgSO_4$ and recrystallized in ethanol to provide a colorless crystal of compound (2). The compound (2) shows the following $^1$H NMR result.

$^1$H NMR ($CDCl_3$, 300 MHz), δ/ppm: 7.45 (d, 2H), 7.43 (2H, d), 3.92 (4H, m), 1.53 (2H, m), 1.27 (16H, m), 0.88 (12H, m).

SYNTHESIS EXAMPLE 1B

Synthesis of compound (3) (2,6-dibromo-4,8-di(2-ethylhexyloxy)benzo[1,2-b:4,5-b']dithiophene)

The compound (2) (5.58 g, 10 mmol) is dissolved in 100 mL of methylene chloride and put into ice water. 60 mL of a methylene chloride solution in which bromine (3.2 g, 20 mmol) is dissolved is slowly added thereto in a dropwise fashion. The reaction mixture is reacted for 5 hours until the bromine color disappears in air and recrystallized in hexane to provide a white solid compound (3) (5.5 g).

The compound (3) shows the following $^1$H NMR result.

$^1$H NMR ($CDCl_3$, 300 MHz), δ/ppm: 7.48 (2H, s), 3.92 (4H, m), 1.55 (2H, m), 1.27 (12H, m), 0.89 (12H, m).

SYNTHESIS EXAMPLE 1C

Synthesis of compound (4) (2,6-bis(trimethyltin)-4,8-di(2-ethylhexyloxy)benzo[1,2-b:4,5-b']dithiophene)

The compound (3) (4.3 g, 6 mmol) is dissolved in 100 mL of tetrahydrofuran (THF) under a nitrogen atmosphere and cooled to −70° C. n-butyllithium (13.2 mmol) is slowly added thereto and reacted at −70° C. for about 1 hour. Trimethyltin chloride (14 mmol) is added thereto, and then the temperature is slowly increased. It is reacted at room temperature of 25° C. for about 2 hours and put in cold water to complete the reaction and extracted with ether two times to provide an organic layer. The obtained organic layer is washed with water. After removing ether under vacuum, it is recrystallized in ethanol to provide a compound (4) as a colorless needle-shaped crystal (yield of 40%).

The compound (4) shows the following $^1$H NMR result.

$^1$H NMR ($CDCl_3$, 300 MHz), δ/ppm: 7.50 (2H, s), 4.19 (4H, m), 1.54 (4H, m), 1.53 (18H, m), 1.10 (12H, m).

SYNTHESIS EXAMPLE 1D

Synthesis of compound (6) (2-trimethyltin-4-tetradecylthiazole)

[Reaction Scheme 4]

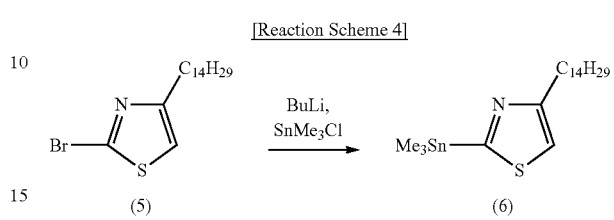

The compound (5) (2-bromo-4-tetradecylthiazole) (12 g, 34.1 mmol) is dissolved in 100 mL of tetrahydrofuran (THF) under a nitrogen atmosphere and cooled to −75° C. n-butyllithium (24 mL, 38.8 mmol) is slowly added and reacted at −75° C. for about 1 hour. Trimethyltin chloride ($Me_3SnCl$) (9.0 g, 45 mmol) is added thereto, and then the temperature is slowly increased. It is reacted at room temperature of 25° C. for about 2 hours and put into cold water to complete the reaction and extracted with ether two times to provide an organic layer. The obtained organic layer is washed with water. After removing the ether under vacuum, it is recrystallized in ethanol to provide a compound (6) (2-trimethyltin-4-tetradecylthiazole as a colorless needle-shaped crystal (6.0 g, 13.6 mmol, yield of 40%).

The compound (6) shows the following $^1$H NMR result.

$^1$H NMR ($CDCl_3$, 300 MHz), δ/ppm: 7.03 (1H, s), 2.87 (2H, t), 2.52 (2H, m), 1.23 (22H, m), 0.82 (3H, m), 0.43 (9H, m)

SYNTHESIS EXAMPLE 1E

Synthesis of compound (7)

[Reaction Scheme 5]

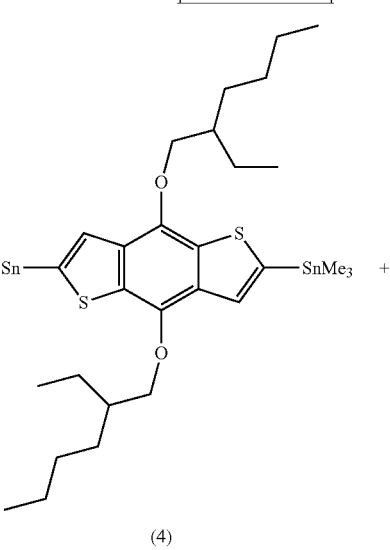

(4)

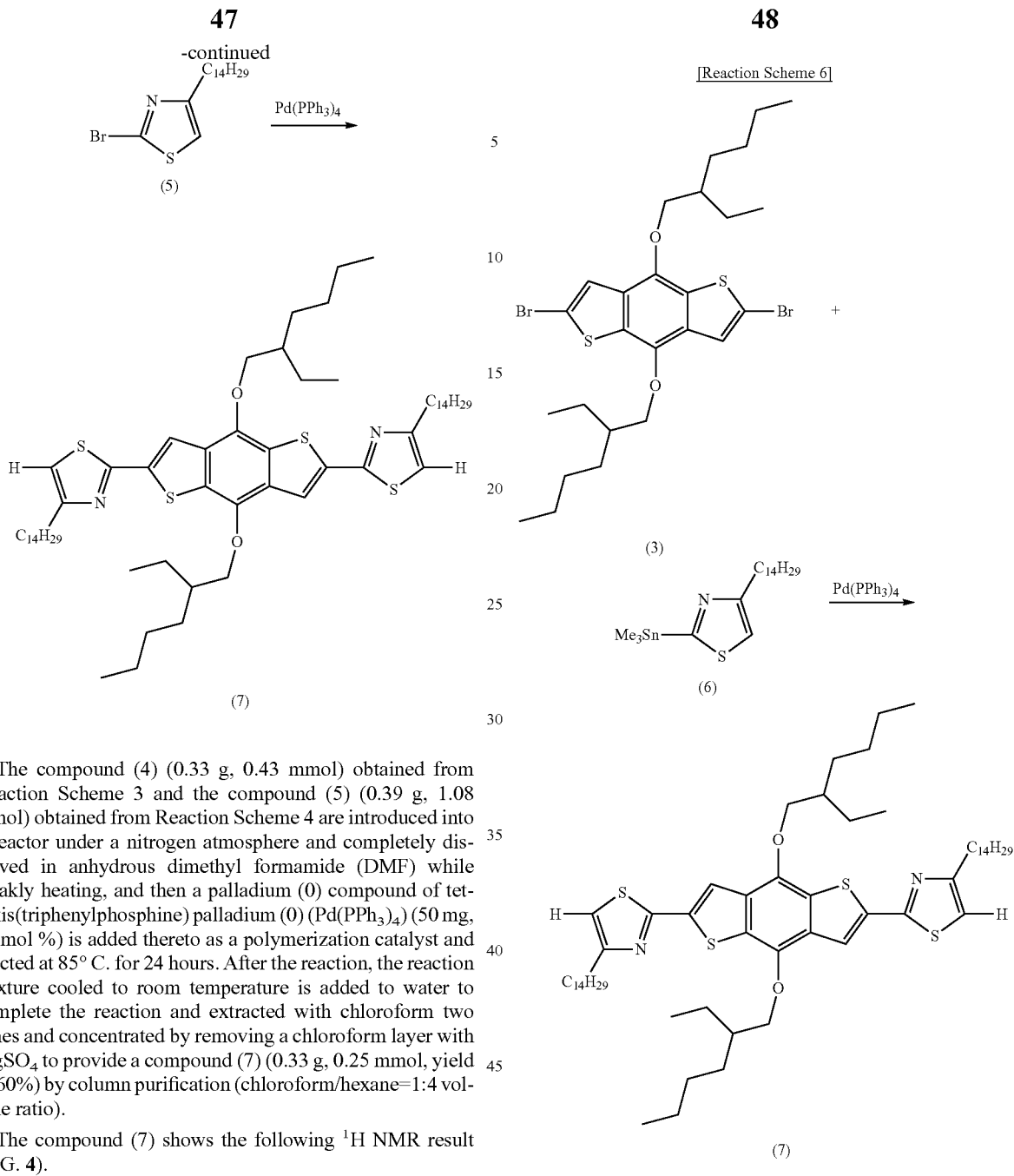

The compound (4) (0.33 g, 0.43 mmol) obtained from Reaction Scheme 3 and the compound (5) (0.39 g, 1.08 mmol) obtained from Reaction Scheme 4 are introduced into a reactor under a nitrogen atmosphere and completely dissolved in anhydrous dimethyl formamide (DMF) while weakly heating, and then a palladium (0) compound of tetrakis(triphenylphosphine) palladium (0) (Pd(PPh$_3$)$_4$) (50 mg, 10 mol %) is added thereto as a polymerization catalyst and reacted at 85° C. for 24 hours. After the reaction, the reaction mixture cooled to room temperature is added to water to complete the reaction and extracted with chloroform two times and concentrated by removing a chloroform layer with MgSO$_4$ to provide a compound (7) (0.33 g, 0.25 mmol, yield of 60%) by column purification (chloroform/hexane=1:4 volume ratio).

Figure 4:
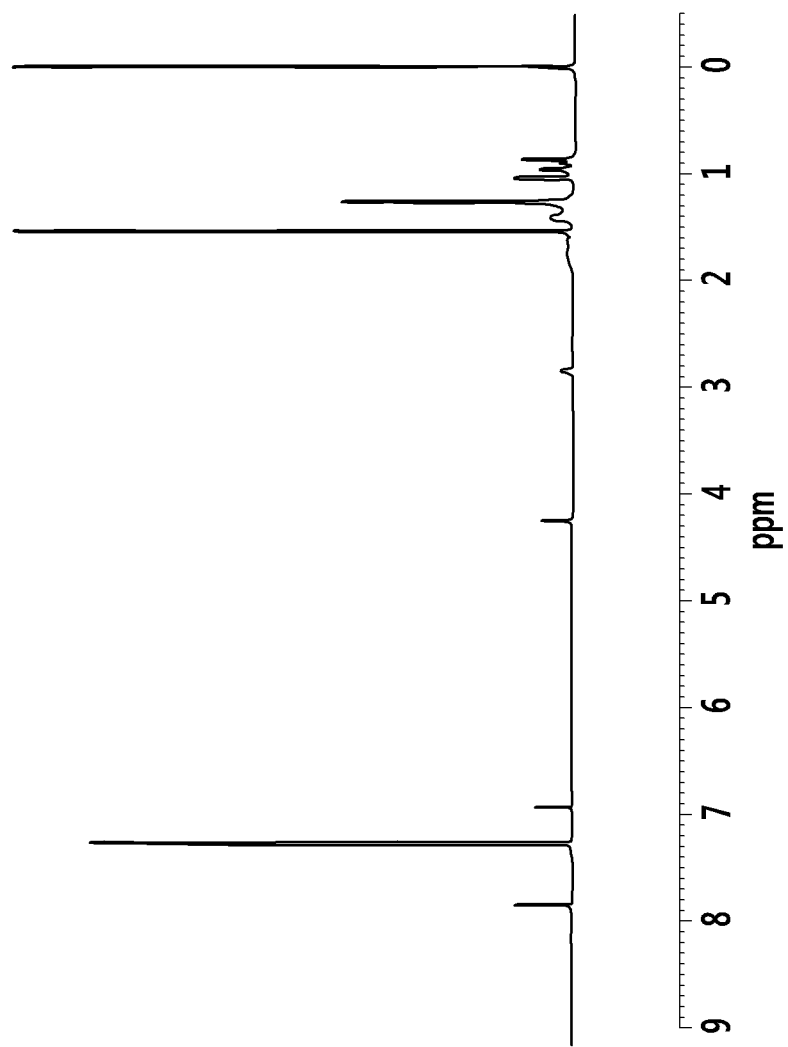
FIG. 4 shows a 1H-NMR spectrum of the organic semiconductor compound (7) according to Example 1.
Figure 5:
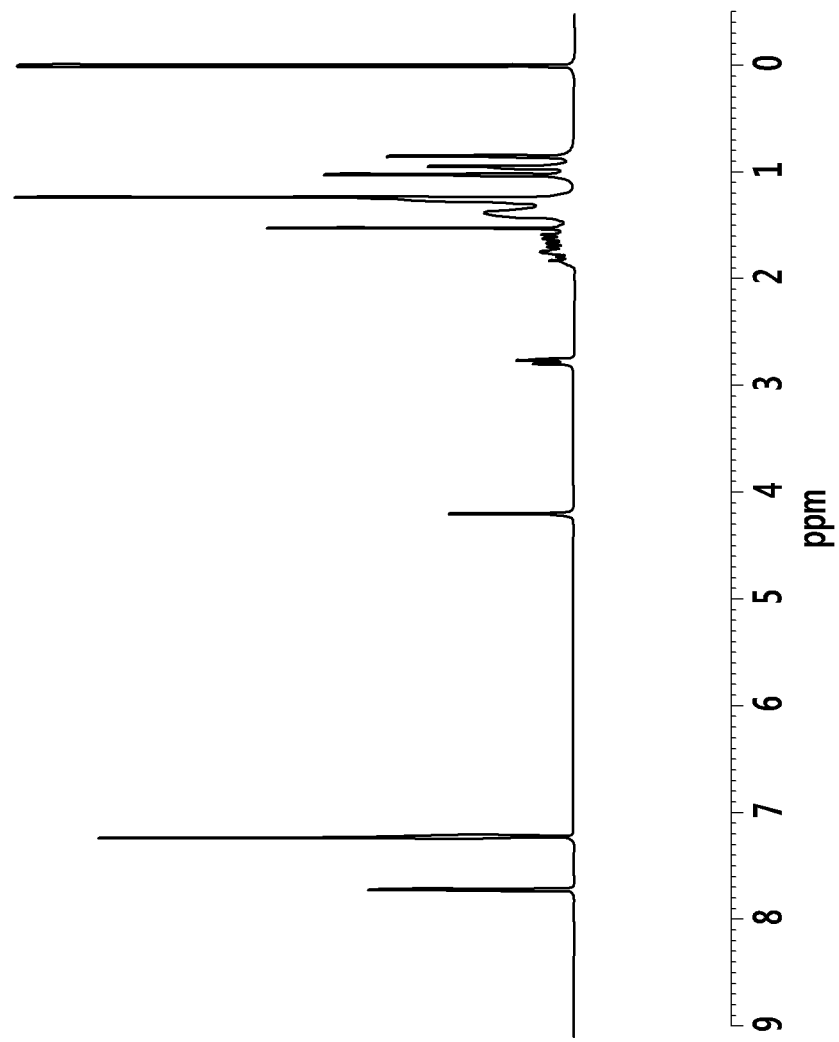
FIG. 5 shows a 1H-NMR spectrum of the organic semiconductor compound (7) according to Example 2.

The compound (7) shows the following $^1$H NMR result (FIG. 4).

$^1$H NMR (CDCl$_3$, 300 MHz), δ/ppm: 7.82 (2H, s), 6.90 (2H, s), 4.23 (4H, d), 1.84-1.51 (12H, m), 1.45-1.25 (52H, broad), 1.05-0.87 (18H, m)

SYNTHESIS EXAMPLE 1F

Synthesis of Compound (7)

As shown in the following Reaction Scheme 6, the compound (3) obtained from Reaction Scheme 3 and the compound (6) obtained from the Reaction Scheme 4 are reacted to provide an organic semiconductor compound (7).

$^1$H NMR (CDCl$_3$, 300 MHz), δ/ppm: 7.82 (2H, s), 6.90 (2H, s), 4.23 (4H, d), 1.84-1.51 (12H, m), 1.45-1.25 (52H, broad), 1.05-0.87 (18H, m).

EXAMPLE 2

Synthesis of organic semiconductor compound (7-1) (monomer)

The compound (7) obtained from Example 1 is reacted with NBS (N-bromosuccinimide) in a chloroform solvent to provide compound (7-1) (yield=76%). The compound (7-1) shows the following $^1$H NMR result (FIG. 2).

$^1$H NMR (CDCl$_3$, 300 MHz), δ/ppm: 7.74 (2H, s), 4.22 (4H, d), 1.84-1.52 (12H, m), 1.06-1.25 (52H, broad), 1.05-0.85 (18H, m)

[Reaction Scheme 7]

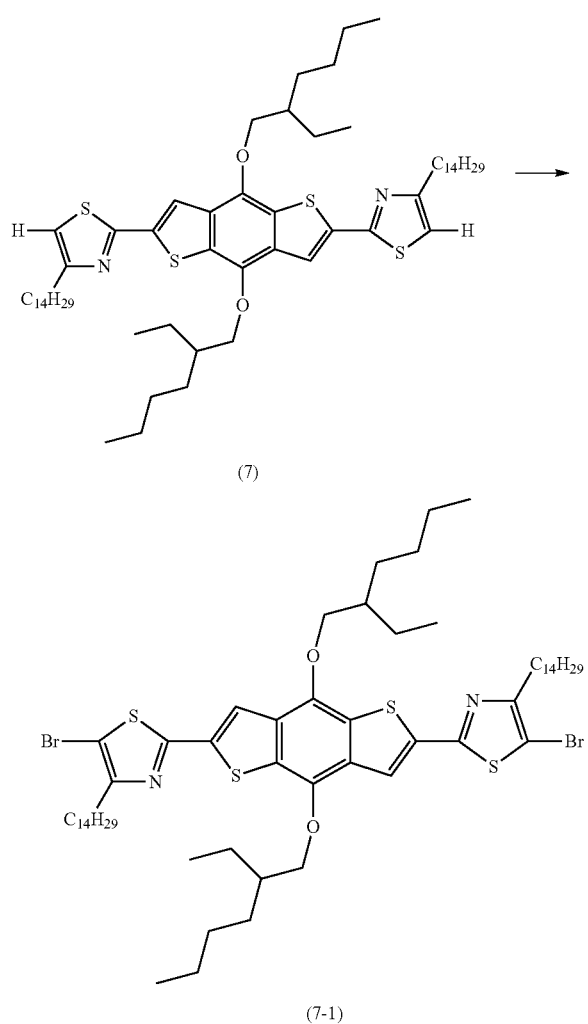

EXAMPLE 3

Synthesis of organic semiconductor compound (8) (monomer)

[Reaction Scheme 8]

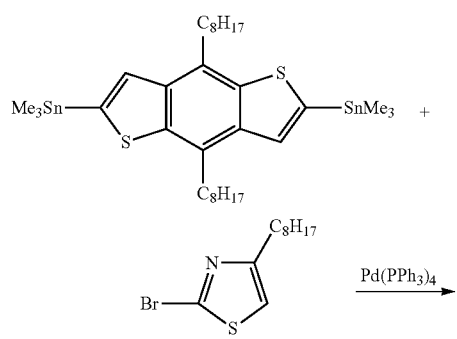

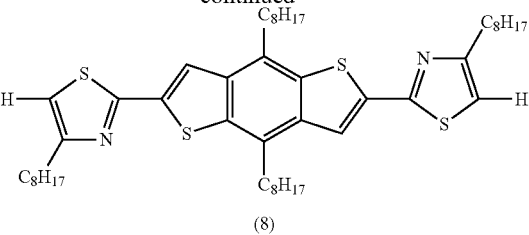

2,6-bis(trimethyltin)-4,8-di(2-octyl)benzo[1,2-b:4,5-b'] dithiophene (1.08 g, 1.5 mmol) and 2-bromo-4-octylthiazole (1.0 g, 3.6 mmol) are completely dissolved in anhydrous dimethyl formamide (DMF) while weakly heating in a reactor under the nitrogen atmosphere, and then a palladium (0) compound of tetrakis(triphenylphosphine) palladium (0) (Pd (PPh$_3$)$_4$) (0.17 g, 1.5 mol %) is added thereto as a polymerization catalyst and reacted at 90° C. for 48 hours. After the reaction, the reaction mixture cooled to room temperature (25° C.) is added to water to complete the reaction and extracted with chloroform two times and concentrated by removing a chloroform layer with MgSO$_4$ to provide compound (8) (0.69 g, 0.84 mmol, yield 56%) by column purification (chloroform/hexane=1:4 volume ratio).

$^1$H NMR (CDCl$_3$, 300 MHz), δ/ppm: 7.82 (2H, s), 6.89 (2H, s), 3.20 (4H, t), 2.87 (4H, t), 1.84-1.51 (16H, m), 1.45-1.25 (32H, broad), 1.05-0.87 (12H, m).

EXAMPLE 4

Synthesis of organic semiconductor compound (9) (monomer)

[Reaction Scheme 9]

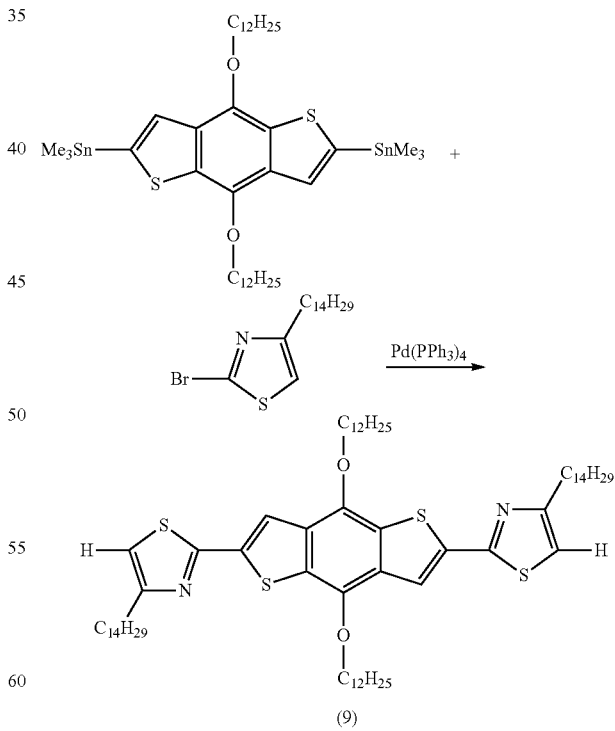

2,6-bis(trimethyltin)-4,8-di(2-decyloxy)benzo[1,2-b:4,5-b']dithiophene (1.77 g, 2.0 mmol) and 2-trimethyltin-4-tetradecylthiazole (0.9 g, 2.5 mmol) are completely dissolved in anhydrous dimethyl formamide (DMF) while weakly heating in a reactor under a nitrogen atmosphere, and then a palladium (0) compound of tetrakis(triphenylphosphine) palladium (0) (Pd(PPh₃)₄) (0.23 g, 0.2 mol %) is added thereto as a polymerization catalyst and reacted at 95° C. for 48 hours. After the reaction, the reaction mixture cooled to room temperature (25° C.) is added to water to complete the reaction and extracted with chloroform two times and concentrated by drying the chloroform layer with MgSO₄ to provide compound (9) (1.1 g, 1.03 mmol, yield of 52%) by column purification (chloroform/hexane=1:4 volume ratio).

$^1$H NMR (CDCl₃, 300 MHz), δ/ppm: 7.82 (2H, s), 6.90 (2H, s), 4.23 (4H, t), 1.54 (16H, m), 1.45-1.25 (76H, broad), 0.89 (12H, m).

EXAMPLE 5

Synthesis of organic semiconductor compound (10) (polymer)

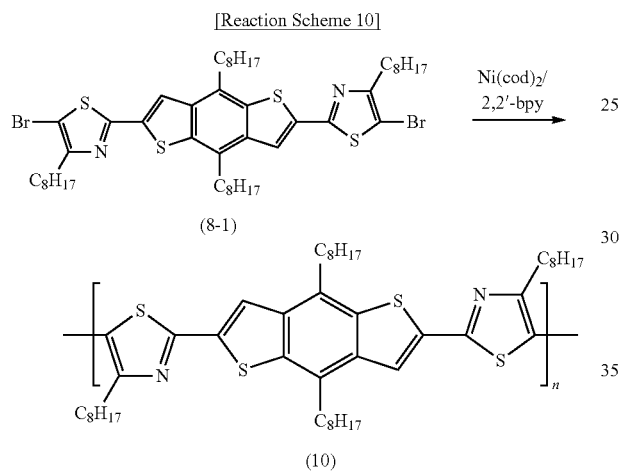

In Reaction Scheme 10, n refers to a degree of polymerization and is determined according to a molecular weight.

The compound (8) according to Example 3 is reacted with NBS (N-bromosuccineimide) in a chloroform solvent in accordance with the same procedure as in Example 2 to provide a compound (8-1). In a reactor under a nitrogen atmosphere, a nickel (0) compound (Ni(cod)₂, 0.5 g, 1.9 mmol), bipyridine (bpy, 0.3 g, 1.9 mmol), and cyclooctadiene (0.22 g) are added into anhydrous DMF (10 mL) and agitated at 60° C. for 30 minutes, and then the compound (8-1) (1.6 g, 1.3 mmol) is added thereto and agitated at about 80° C. for about 48 hours. After the reaction, the reaction solution cooled to room temperature of 25° C. is added to about 1.2 L of a mixed solution of ammonia water/methanol (1:2 volume ratio) and agitated for about 12 hours to complete the reaction, and then filtered under reduced pressure. The obtained reactant is dissolved in chloroform and washed with a hydrochloric acid aqueous solution, ammonia water, and water each for 12 hours to provide a chloroform solution. The obtained chloroform solution is concentrated and reprecipitated in methanol and dried for 24 hours to provide an organic semiconductor compound (10) (yield=75%, number average molecular weight=about 15,000 (measured by GPC (gel permeation chromatography)).

The organic semiconductor compound (10) shows the following $^1$H NMR result.

$^1$H NMR (CDCl₃, 300 MHz), δ/ppm: 7.08, 4.24, 2.95, 1.85-1.6, 1.59-1.2, 1.19-0.85.

EXAMPLE 6

Synthesis of organic semiconductor compound (11) (polymer)

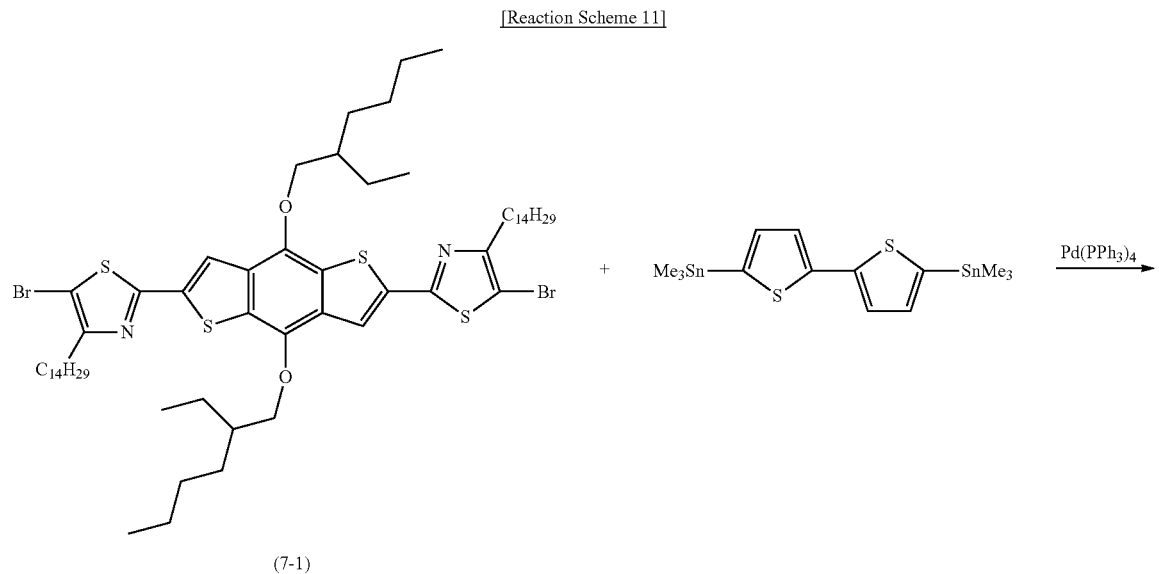

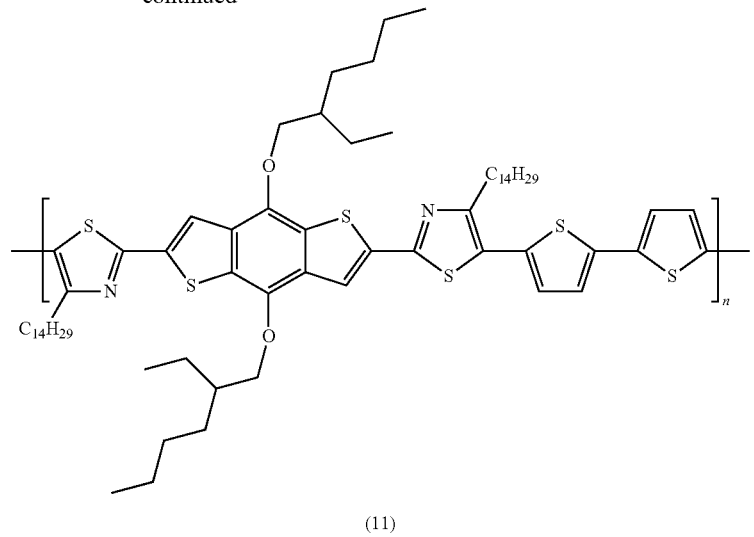

(11)

In Reaction Scheme 11, n refers to a degree of polymerization and is determined according to a molecular weight.

The compound (7-1) (0.5 g, 0.38 mmol) according to Example 2 and bis(trimethylstannyl)bithiophene (0.19 g, 0.38 mmol) are introduced into a reactor under a nitrogen atmosphere and completely dissolved in anhydrous DMF while weakly heating, and then a palladium (0) compound of tetrakis(triphenylphosphine) palladium (0) (Pd(PPh$_3$)$_4$) (44 mg, 10 mol %) is added thereto as a polymerization catalyst and reacted at 85° C. for 5 hours. 2-tributylstannyl thiophene is added in excess amount (1.4 g, 3.8 mmol) based on the compound (7-1) and reacted for 24 hours. After the reaction, the reaction mixture cooled to room temperature of 25° C. is filtered to provide a polymer solid. The polymer solid is washed with a hydrochloric acid aqueous solution/chloroform two times, an ammonia aqueous solution/chloroform two times, and water/chloroform two times, and then the polymer is recovered by Soxhlet extraction using methanol, acetone, methylene chloride, and chloroform. After drying, the organic semiconductor compound (11) is obtained (yield=46%, number average molecular weight=about 20,000, measured by GPC (gel permeation chromatography).

The organic semiconductor compound (11) shows the following $^1$H NMR result.

$^1$H NMR (CDCl$_3$, 300 MHz), δ/ppm: 7.08, 6.60, 4.24, 2.95, 1.85-1.6, 1.59-1.2, 1.19-0.85,

EXAMPLE 7

Synthesis of organic semiconductor compound (12) (polymer)

[Reaction Scheme 12]

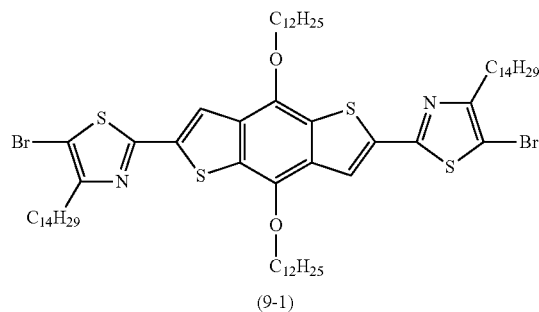

(9-1)

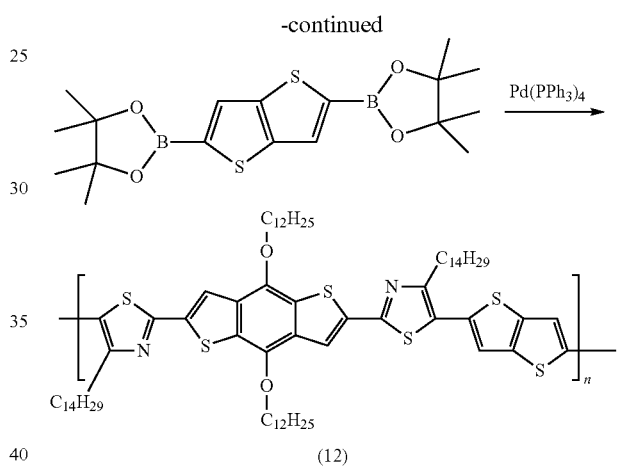

(12)

In Reaction Scheme 12, n refers to a degree of polymerization and is determined according to a molecular weight.

The compound (9) according to Example 4 is reacted with NBS (N-bromosuccinimide) in accordance with the same procedure as in Example 2 to provide a compound (9-1). The compound (9-1) (0.4 g, 0.32 mmol) and 2,6-bis(boronic acid pinacol ester)thieno[3,2-b]thiophene) (0.12 g, 0.32 mmol) are introduced into a reactor under a nitrogen atmosphere and completely dissolved in toluene while weakly heating, and then added with 5 ml of a solution in which a palladium (0) compound of tetrakis(triphenylphosphine) palladium (0) (Pd (PPh$_3$)$_4$) (36 mg, 10 mol %) and Aliquat 336 (Starks' catalyst) (60 mg) are dissolved in toluene as a polymerization catalyst, and 2 M of a Na$_2$CO$_3$ aqueous solution (4 mL), and reacted at 90° C. for 24 hours. After the reaction, the reaction mixture cooled to room temperature of 25° C. is filtered to provide a polymer solid. The polymer solid is washed with a hydrochloric acid aqueous solution/chloroform two times, an ammonia aqueous solution/chloroform two times, and water/chloroform two times, and then the polymer is recovered by Soxhlet extraction using methanol, acetone, methylene chloride, and chloroform. After drying, the organic semiconductor compound (12) is obtained (yield=46%, number average molecular weight=about 20,000, measured by GPC (gel permeation chromatography).

The organic semiconductor compound (12) shows the following $^1$H NMR result.

$^1$H NMR (CDCl$_3$, 300 MHz), δ/ppm: 7.16 (2H), 6.88 (2H), 4.23 (4H), 1.54 (8H), 1.45-1.25 (36H), 0.89 (6H).

EXAMPLE 8

Fabrication of organic thin film transistor (OTFT)

First, a glass substrate is cleaned, chromium used as a gate electrode is deposited thereon at a thickness of 1000 Å using a sputtering method, and SiO$_2$ used as a gate insulating layer is deposited on the gate electrode at a thickness of 3000 Å using a CVD method. Then, Au used as a source-drain electrode is deposited at a thickness of 700 Å on the gate insulating layer using a sputtering method. The substrate is rinsed with isopropyl alcohol for 10 minutes and dried before depositing organic semiconductor polymers.

The SiO$_2$ gate insulating layer is treated with UV/O$_3$ for 30 minutes. The resultant is dipped in an octadecyltrichlorosilane solution diluted to have 10 mM of a concentration in n-hexane for 30 minutes, and rinsed with hexane and ethanol. Then, the organic semiconductor compound (11) according to the Example 6 is dissolved in a chloroform solvent at a concentration of 1.0 wt %. The solution is coated with spin-coating and baked at 150° C. for one hour under a nitrogen atmosphere to form an active layer, fabricating an organic thin film transistor (OTFT) device shown in FIG. 1.

Figure 6:
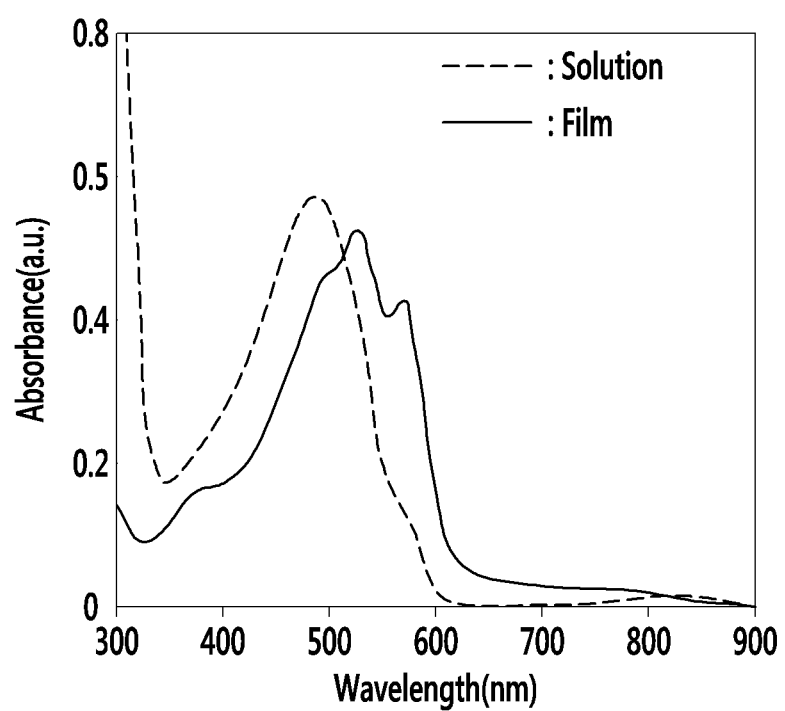
FIG. 6 shows UV absorption spectra of the organic semiconductor compound (11) according to Example 6 in a solution state and a film state.

The organic semiconductor compound (11) according to the Example 6 is dissolved in a chloroform solvent at a concentration of 1.0 wt %. The solution is coated with spin-coating and baked at 100° C. for one hour under a nitrogen atmosphere to form a film. UV-Vis absorption spectra of the organic semiconductor compound (11) according to Example 6 that is dissolved in a chloroform solvent and that is formed in a film are shown in FIG. 6. As shown in FIG. 6, the organic semiconductor compound (11) in a form of a film shows a wavelength shifted to a long wavelength. These results indicate that the organic semiconductor compound (11) formed in a film realizes good molecular arrangement and stacking.

Figure 7:
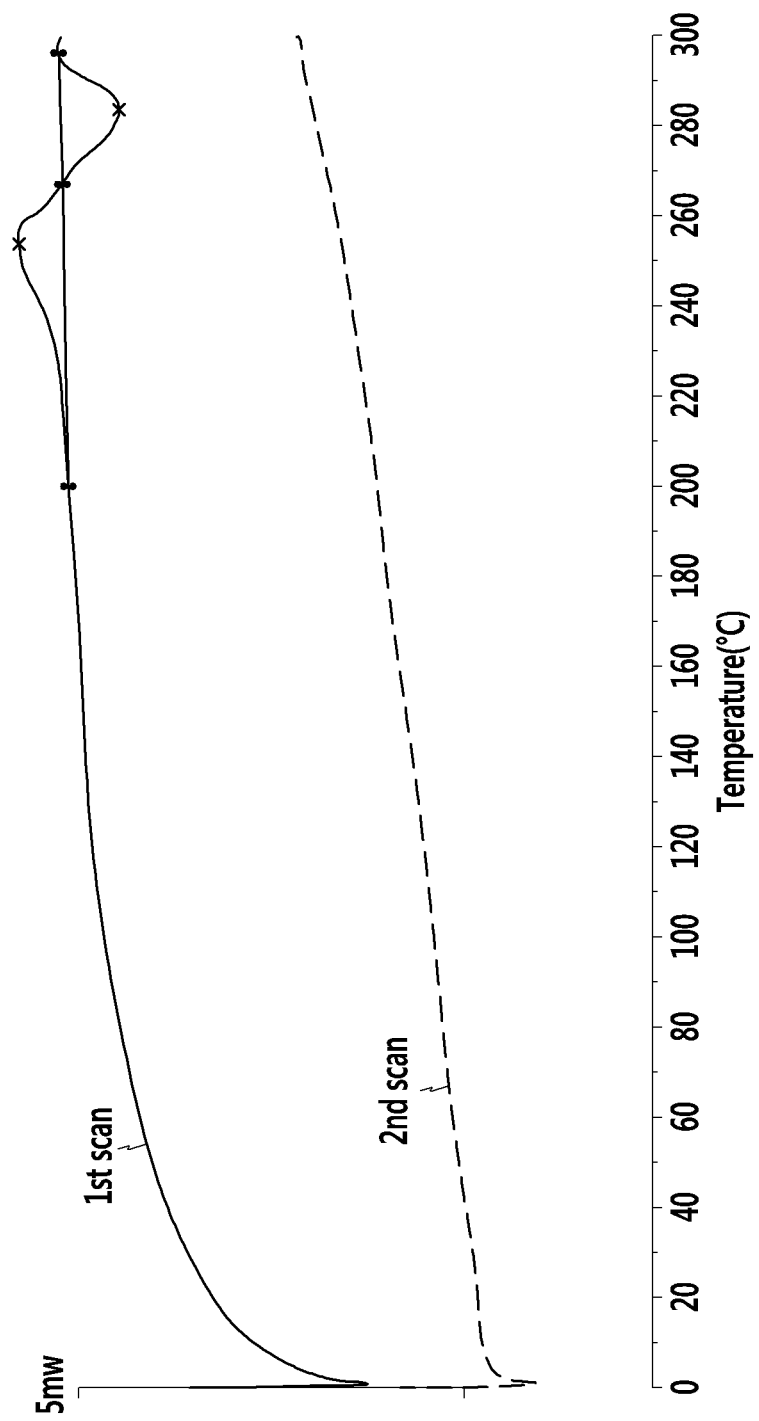
FIG. 7 shows differential scanning calorimetry (DSC) analysis result of the organic semiconductor compound (11) according to Example 6.

FIG. 7 shows differential scanning calorimetry (DSC) analysis result of the organic semiconductor compound (11) according to Example 6. FIG. 7 shows that the organic semiconductor compound (11) has good thermal stability.

Figure 8:
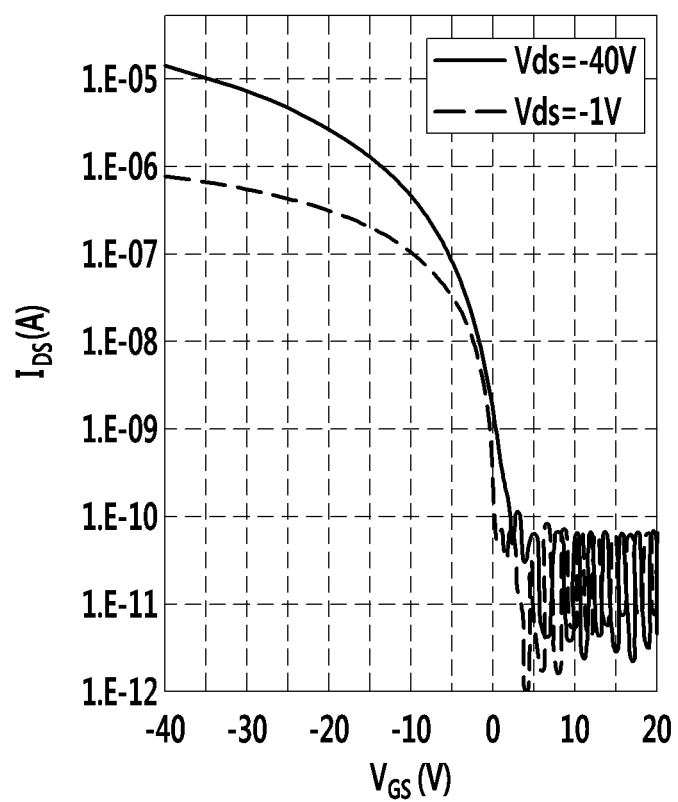
FIG. 8 shows current transfer characteristics of the organic thin film transistor (OTFT) including the organic semiconductor compound (11) according to Example 6.

Current transfer characteristics of the OTFT fabricated according to Example 8 are measured using a semiconductor characterization system (4200-SCS) (KEITHLEY). The results are shown in FIG. 8. As shown in FIG. 8, OTFT according to Example 8 has improved charge mobility (0.193 cm$^2$/Vs).

While this disclosure has been described in connection with various example embodiments, it is to be understood that the disclosure is not limited to the disclosed embodiments, but, on the contrary, is intended to cover various modifications and equivalent arrangements included within the spirit and scope of the appended claims.

<Description of symbols>

10, 20: transistor 12, 22, 31: substrate 14, 24: gate electrode 16, 26: insulation layer 17a, 27a: source electrode 17b, 27b: drain electrode 18, 28: active layer 30: organic solar cell 32: anode 33: hole transport layer (HTL)

34: active layer 35: cathode

What is claimed is:
1. An organic electronic device comprising:
an organic semiconductor compound represented by the following Chemical Formula 1,

[Chemical Formula 1]

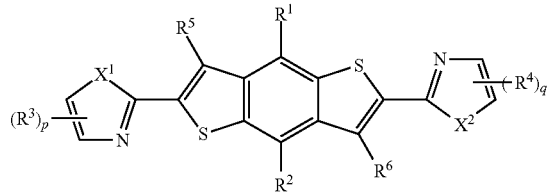

wherein, in the above Chemical Formula 1,
X$^1$ and X$^2$ are each independently S, Se, or NR$^a$ (wherein, R$^a$ is selected from hydrogen, a substituted or unsubstituted C1 to C30 linear or branched alkyl group, a substituted or unsubstituted C3 to C30 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group),
R$^1$ to R$^4$ are each independently selected from a halogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, a substituted or unsubstituted C2 to C30 heteroaryl group, —COR$^b$ (wherein R$^b$ is selected from a substituted or unsubstituted C1 to C20 linear or branched alkyl group, a substituted or unsubstituted C3 to C30 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group), and —C(=O)OR$^c$ (wherein R$^c$ is selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group),
R$^5$ and R$^6$ are each independently hydrogen or a C1 to C10 alkyl group, and
p and q are integers ranging from 1 to 2.
2. The organic electronic device of claim 1, wherein the organic semiconductor compound is selected from a structural unit represented by the following Chemical Formula 9:

[Chemical Formula 9]

(9-1)

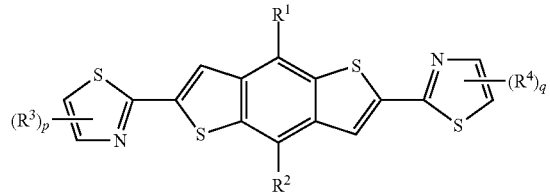

-continued (9-2)

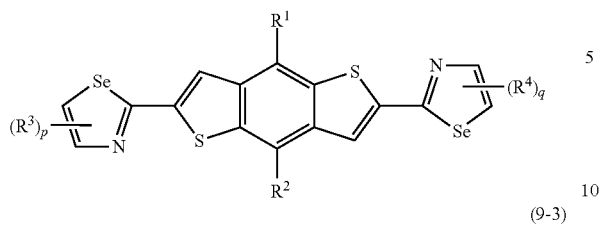

(9-3)

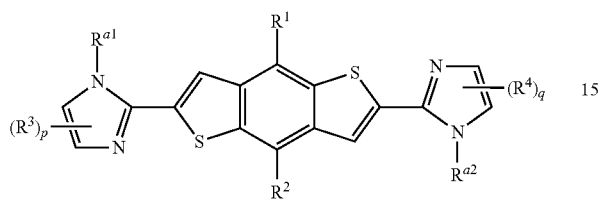

wherein, in the above Chemical Formula 9,
$R^{a1}$ to $R^{a2}$ are selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group.

3. The organic electronic device of claim 1, wherein the organic semiconductor compound is represented by the following Chemical Formula 2,

[Chemical Formula 2]

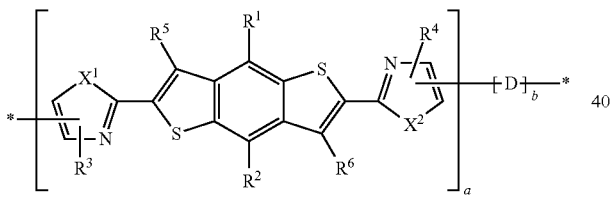

wherein, in the above Chemical Formula 2,
-D- is a substituted or unsubstituted C1 to C20 alkylene group, a substituted or unsubstituted C4 to C20 aromatic ring, a substituted or unsubstituted C4 to C14 heteroaromatic ring, or a substituted or unsubstituted C6 to C30 condensed polycyclic group including a heteroaromatic ring, and a and b represent a mole ratio of each structural unit, wherein a ranges from about 1 mol % to about 100 mol %, and b ranges from about 0 mol % to about 99 mol %, a sum of a and b totaling 100 mol %.

4. The organic electronic device of claim 3, wherein -D- is selected from a structural unit represented by the following Chemical Formula 3,

[Chemical Formula 3]

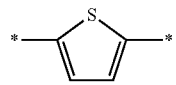 (1)

-continued

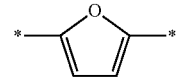 (2)

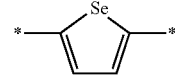 (3)

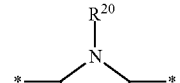 (4)

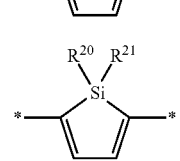 (5)

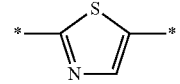 (6)

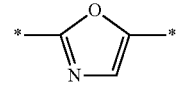 (7)

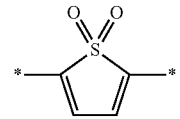 (8)

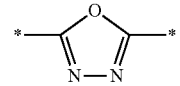 (9)

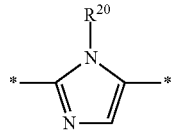 (10)

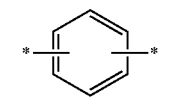 (11)

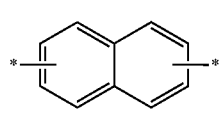 (12)

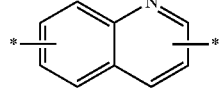 (13)

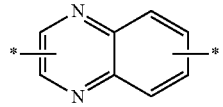 (14)

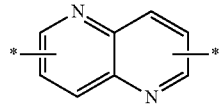 (15)

(16) 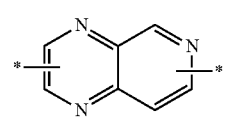
(17) 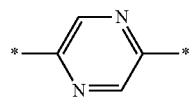
(18) 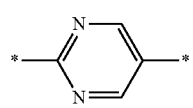
(19) 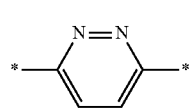
(20) 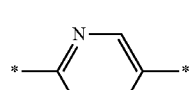
(21) 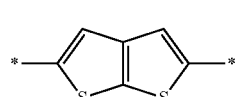
(22) 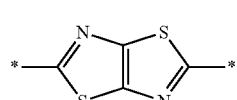
(23) 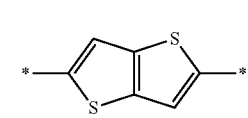
(24) 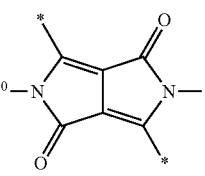
(25) 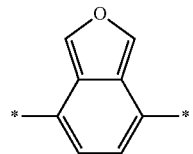
(26) 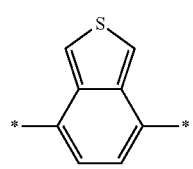
(27) 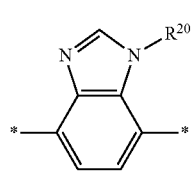
(28) 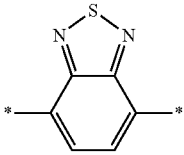
(29) 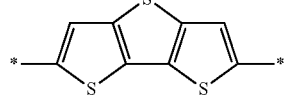
(30) 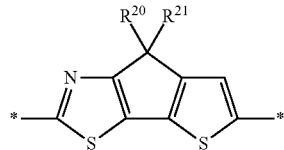
(31) 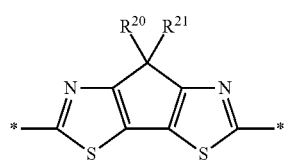
(32) 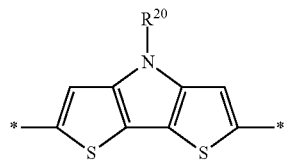
(33) 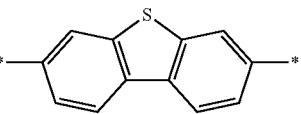
(34) 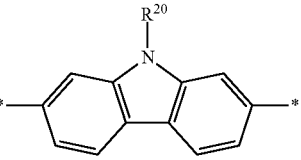
(35) 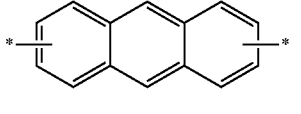
(36) 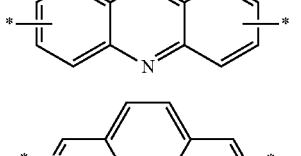
(37) 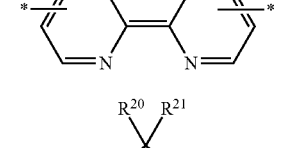
(38)

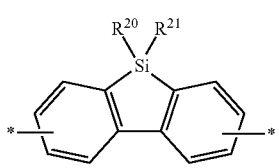
(39)
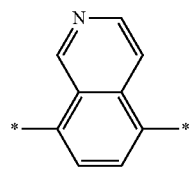
(40)
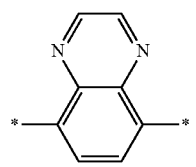
(41)
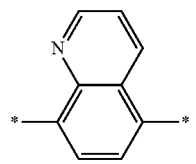
(42)
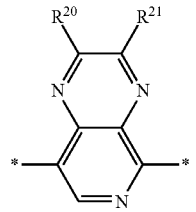
(43)
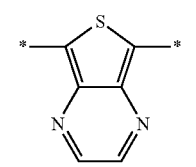
(44)
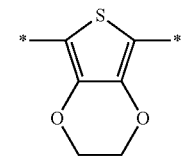
(45)
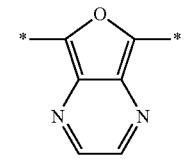
(46)
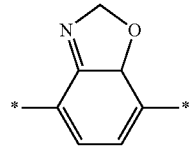
(47)
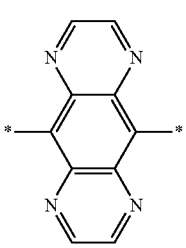
(48)
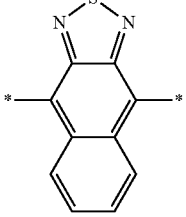
(49)
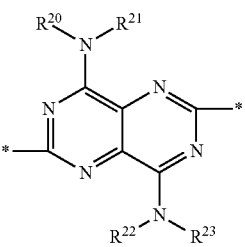
(50)
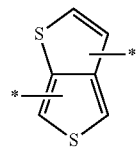
(51)
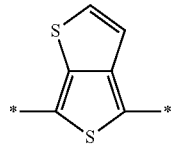
(52)
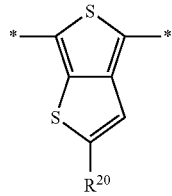
(53)
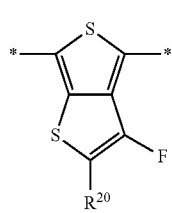
(54)
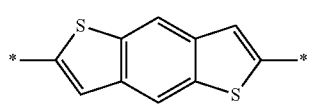
(55)

-continued

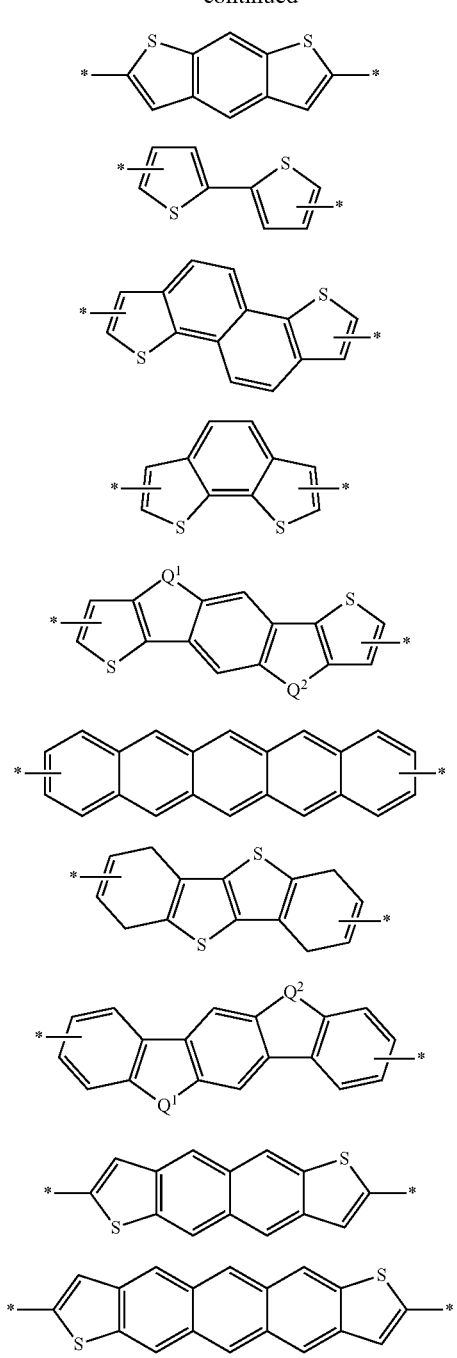

(56)
(57)
(58)
(59)
(60)
(61)
(62)
(63)
(64)
(65)

wherein, in the above Chemical Formula 3,
R$^{20}$ to R$^{23}$ are each independently selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, a substituted or unsubstituted C2 to C30 heteroaryl group, and a combination thereof,
Q$^1$ and Q$^2$ are each independently S, CR$^{24}$R$^{25}$, NR$^{26}$, or SiR$^{27}$R$^{28}$, wherein R$^{24}$ to R$^{28}$ are each independently hydrogen, a substituted or unsubstituted C1 to C15 linear or branched alkyl group, a substituted or unsubstituted C3 to C15 cycloalkyl group, a substituted or unsubstituted C1 to C15 alkoxy group, a substituted or unsubstituted C6 to C15 aryl group, a substituted or unsubstituted C2 to C15 heteroaryl group, and a combination thereof, and a hydrogen of —CH— or —CH$_2$— positioned in the aromatic ring or heteroaromatic ring of the above Chemical Formula 3 is optionally substituted with one selected from a fluoro group, a C1 to C10 fluoroalkyl group, a C1 to C20 linear or branched alkyl group, a C3 to C20 cycloalkyl group, a C1 to C20 alkoxy group, a substituted or unsubstituted C6 to C30 aryl group, and a substituted or unsubstituted C2 to C30 heteroaryl group.

5. The organic electronic device of claim 3, wherein -D- is represented by the following Chemical Formula 4,

[Chemical Formula 4]

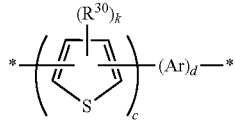

wherein, in above Chemical Formula 4,
R$^{30}$ is selected from hydrogen, a substituted or unsubstituted C4 to C20 aromatic ring, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, k is an integer ranging from 1 to 2, —Ar— is a substituted or unsubstituted C4 to C20 aromatic ring, a substituted or unsubstituted C4 to C14 heteroaromatic ring, or a substituted or unsubstituted C6 to C30 condensed polycyclic group including a heteroaromatic ring, and c and d represent a mole ratio of each structural unit, wherein c ranges from about 1 mol % to about 99 mol %, and d ranges from about 1 mol % to about 99 mol %, a sum of c and d totaling 100 mol %.

6. The organic electronic device of claim 5, wherein —Ar— is selected from a structural unit represented by Chemical Formula 3,

[Chemical Formula 3]

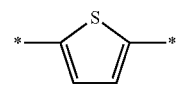 (1)

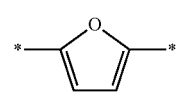 (2)

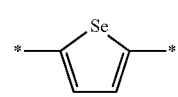 (3)

-continued
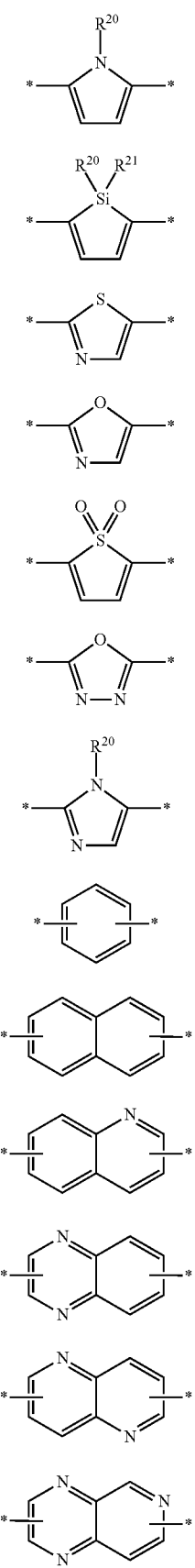
(4)
(5)
(6)
(7)
(8)
(9)
(10)
(11)
(12)
(13)
(14)
(15)
(16)
-continued
 (17)
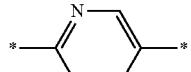 (18)
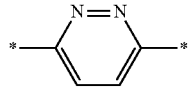 (19)
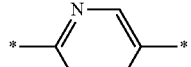 (20)
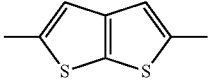 (21)
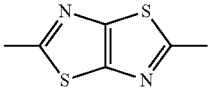 (22)
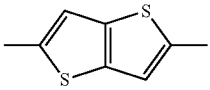 (23)
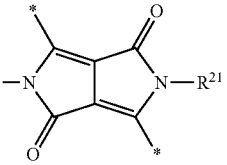 (24)
 (25)
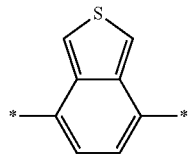 (26)
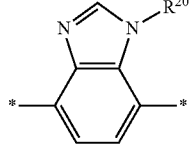 (27)
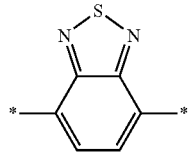 (28)

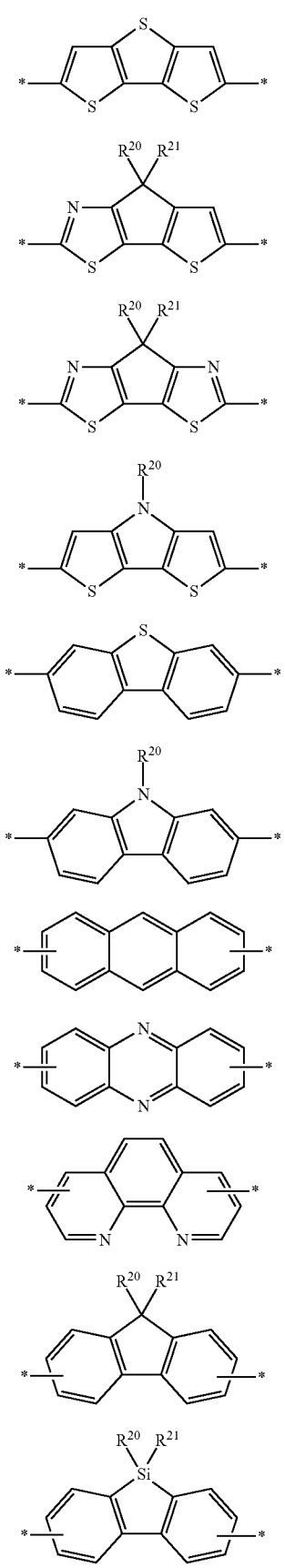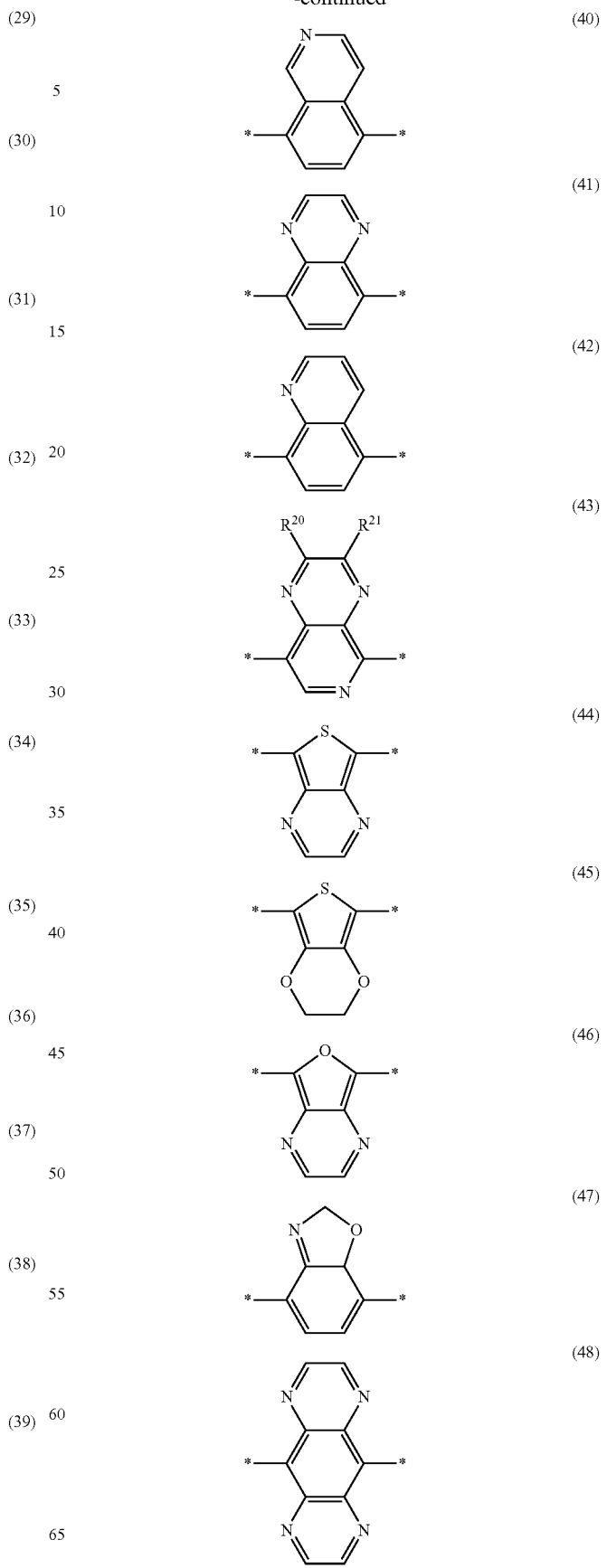

-continued

(49)
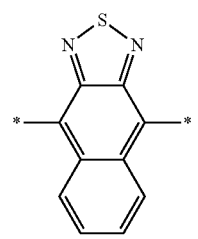

(50)
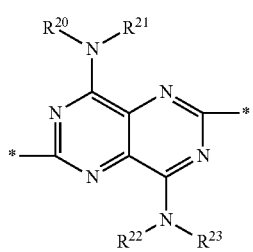

(51)
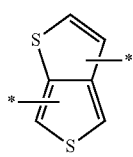

(52)
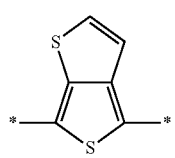

(53)
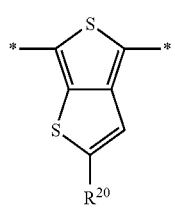

(54)
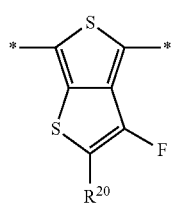

(55)
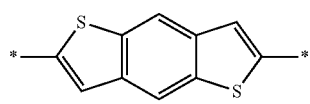

(56)
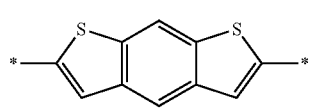

(57)
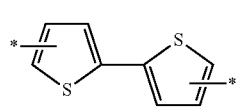

-continued

(58)
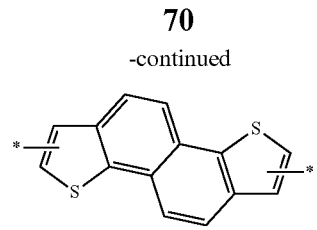

(59)
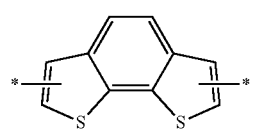

(60)
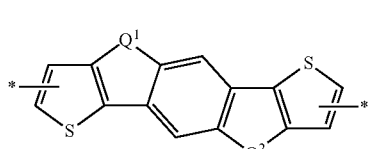

(61)
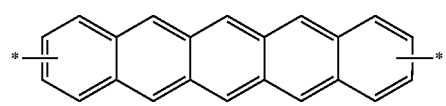

(62)
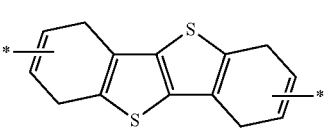

(63)
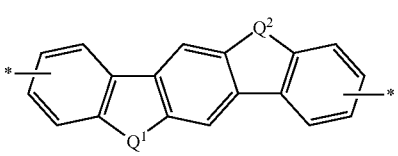

(64)
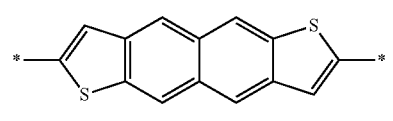

(65)
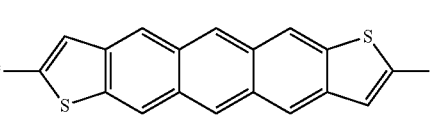

wherein, in the above Chemical Formula 3, $R^{20}$ to $R^{23}$ are each independently selected from hydrogen, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, a substituted or unsubstituted C2 to C30 heteroaryl group, and a combination thereof, $Q^1$ and $Q^2$ are each independently S, $CR^{24}R^{25}$, $NR^{26}$, or $SiR^{27}R^{28}$, wherein $R^{24}$ to $R^{28}$ are each independently hydrogen, a substituted or unsubstituted C1 to C15 linear or branched alkyl group, a substituted or unsubstituted C3 to C15 cycloalkyl group, a substituted or unsubstituted C1 to C15 alkoxy group, a substituted or unsubstituted C6 to C15 aryl group, a substituted or unsubstituted C2 to C15 heteroaryl group, and a combination thereof, and a hydrogen of —CH— or —CH$_2$— positioned in the aromatic ring or heteroaromatic ring of the above Chemical Formula 3 is optionally substituted with one selected from a fluoro group, a C1 to C10 fluoroalkyl group, a C1 to C20 linear or branched alkyl group, a C3 to C20 cycloalkyl group, a C1 to C20 alkoxy group, a substituted or unsubstituted C6 to C30 aryl group, and a substituted or unsubstituted C2 to C30 heteroaryl group.

7. The organic electronic device of claim 1, wherein the organic semiconductor compound represented by Chemical Formula 1 includes a terminal functional group represented by the following Chemical Formulas 5 to 8:

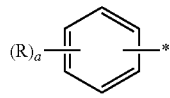
[Chemical Formula 5]

wherein, in the above Chemical Formula 5,
R is a fluoro group or a C1 to C20 perfluoroalkyl group, and
a is an integer ranging from 1 to 5,

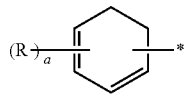
[Chemical Formula 6]

wherein, in the above Chemical Formula 6,
R is a fluoro group or a C1 to C20 perfluoroalkyl group, and
a is an integer ranging from 1 to 6,

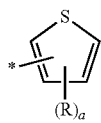
[Chemical Formula 7]

wherein, in the above Chemical Formula 7,
R is a fluoro group or a C1 to C20 perfluoroalkyl group, and
a is an integer ranging from 1 to 3,

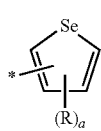
[Chemical Formula 8]

wherein, in the above Chemical Formula 8,
R is a fluoro group or a C1 to C20 perfluoroalkyl group, and
a is an integer ranging from 1 to 3.

8. The organic electronic device of claim 3, wherein the organic semiconductor compound represented by Chemical Formula 2 includes a terminal functional group represented by the following Chemical Formulas 5 to 8:

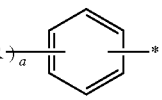
[Chemical Formula 5]

wherein, in the above Chemical Formula 5,
R is a fluoro group or a C1 to C20 perfluoroalkyl group, and
a is an integer ranging from 1 to 5,

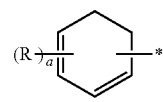
[Chemical Formula 6]

wherein, in the above Chemical Formula 6,
R is a fluoro group or a C1 to C20 perfluoroalkyl group, and
a is an integer ranging from 1 to 6,

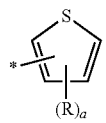
[Chemical Formula 7]

wherein, in the above Chemical Formula 7,
R is a fluoro group or a C1 to C20 perfluoroalkyl group, and
a is an integer ranging from 1 to 3,

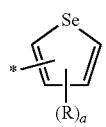
[Chemical Formula 8]

wherein, in the above Chemical Formula 8,
R is a fluoro group or a C1 to C20 perfluoroalkyl group, and
a is an integer ranging from 1 to 3.

9. The organic electronic device of claim 3, wherein the organic semiconductor compound represented by the above Chemical Formula 2 includes a structural unit represented by the following Chemical Formula 10:

[Chemical Formula 10]

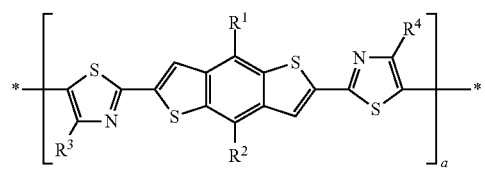
(10-1)

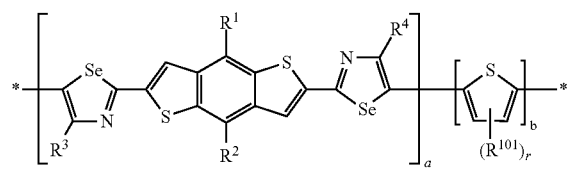
(10-2)

-continued
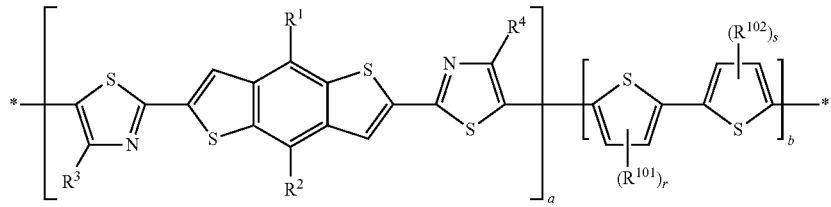
(10-3)
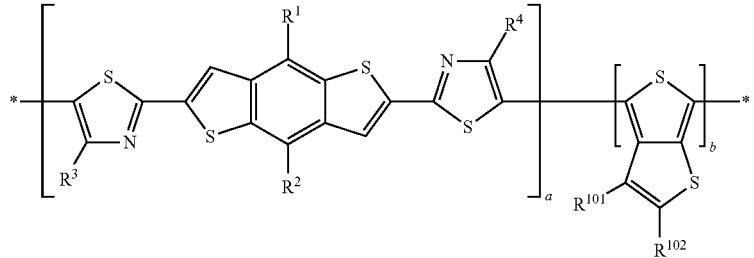
(10-4)
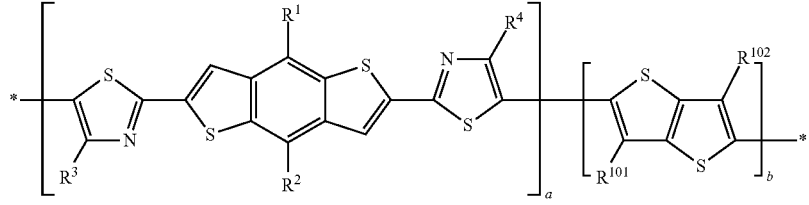
(10-5)
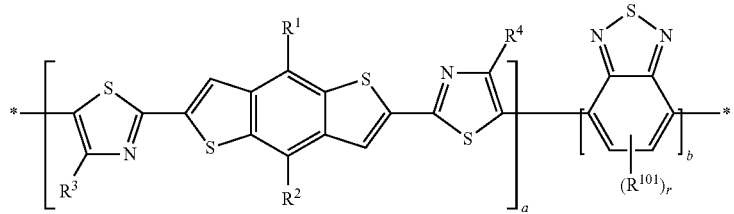
(10-6)
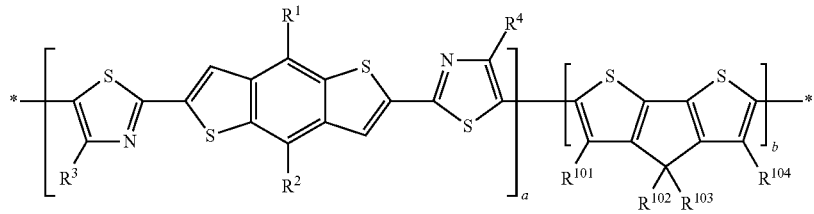
(10-7)
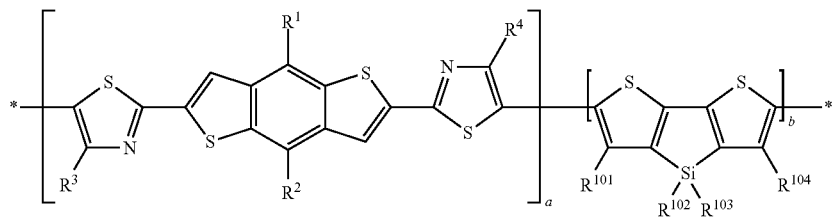
(10-8)
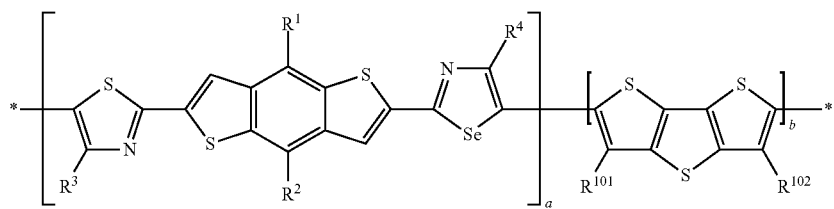
(10-9)

-continued (10-10) 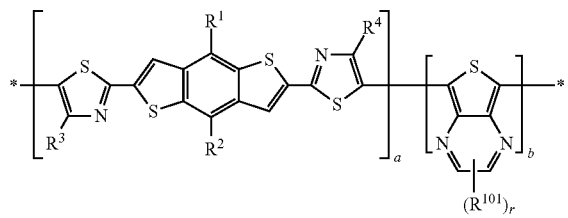

(10-11) 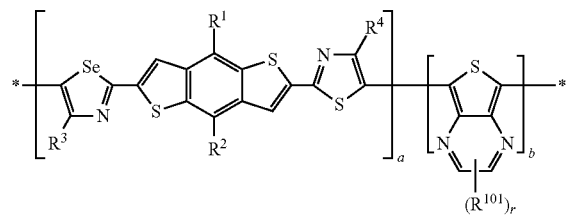

(10-12) 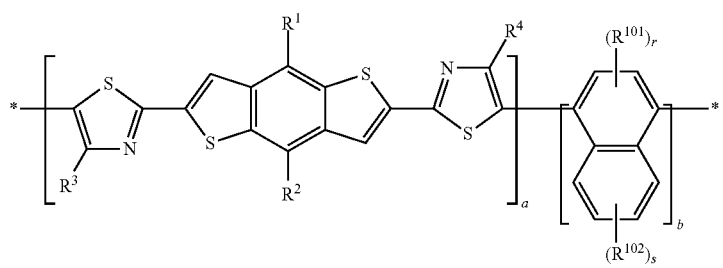

(10-13) 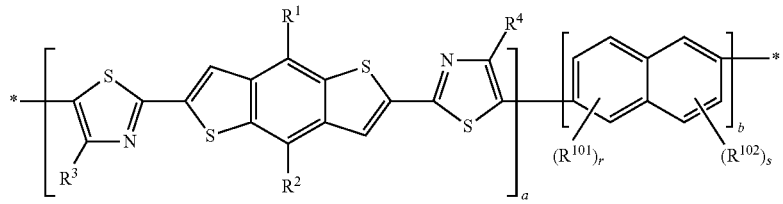

(10-14) 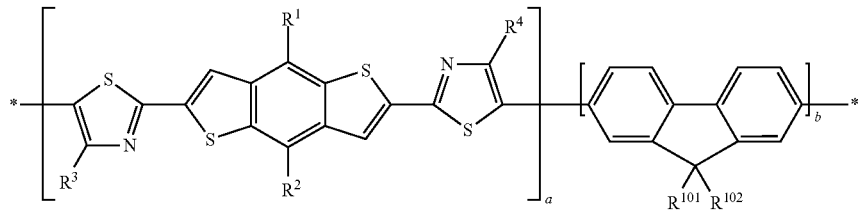

(10-15) 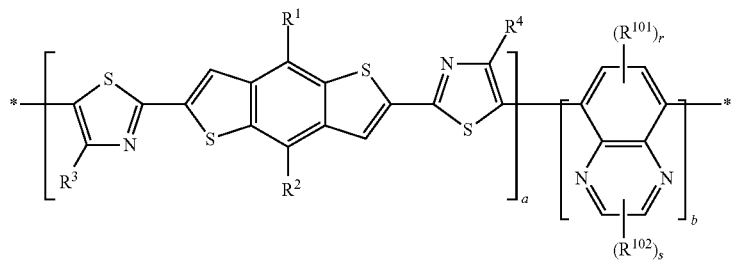

wherein, in above Chemical Formula 10, $R^{101}$ and $R^{102}$ are each independently selected from hydrogen, a substituted or unsubstituted C4 to C20 aromatic ring, a substituted or unsubstituted C1 to C30 linear or branched alkyl group, a substituted or unsubstituted C3 to C20 cycloalkyl group, a substituted or unsubstituted C1 to C30 linear or branched alkoxy group, a substituted or unsubstituted C6 to C30 aryl group, a substituted or unsubstituted C7 to C30 arylalkyl group, and a substituted or unsubstituted C2 to C30 heteroaryl group, and r and s are integers ranging from 1 to 2.

10. The organic electronic device of claim 1, wherein the organic electronic device is selected from a transistor, a solar cell, a memory device, an organic light emitting diode (OLED), a photosensor, and a laser device.

11. The organic electronic device of claim 10, wherein the transistor includes a gate electrode disposed on a substrate; a source electrode and a drain electrode facing each other and defining a channel region; an insulation layer electrically insulating the source electrode and drain electrode and the gate electrode;

and an active layer including the organic semiconductor compound formed in the channel region.

12. The organic electronic device of claim 3, wherein the organic electronic device is selected from a transistor, a solar cell, a memory device, an organic light emitting diode (OLED), a photosensor, and a laser device.

13. The organic electronic device of claim 12, wherein the transistor includes a gate electrode disposed on a substrate; a source electrode and a drain electrode facing each other and defining a channel region; an insulation layer electrically insulating the source electrode and drain electrode and the gate electrode; and an active layer including the organic semiconductor compound formed in the channel region.

14. The organic electronic device of claim 1, wherein the halogen is one of —F, —Cl, —Br and —I.

* * * * *